(12) United States Patent  
Okita

(10) Patent No.: US 8,090,875 B2  
(45) Date of Patent: Jan. 3, 2012

(54) DEVICE AND METHOD FOR CONNECTING DEVICE MANUFACTURING PROCESSING APPARATUSES, PROGRAM, DEVICE MANUFACTURING PROCESSING SYSTEM, EXPOSURE APPARATUS AND METHOD, AND MEASUREMENT AND INSPECTION APPARATUS AND METHOD

(75) Inventor: Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 355 days.

(21) Appl. No.: 11/585,816

(22) Filed: Oct. 25, 2006

(65) Prior Publication Data

US 2007/0142950 A1  Jun. 21, 2007

Related U.S. Application Data

(60) Provisional application No. 60/738,570, filed on Nov. 22, 2005.

(30) Foreign Application Priority Data

Oct. 28, 2005  (JP) .................................. 2005-314759

(51) Int. Cl.
  *G06F 15/16* (2006.01)
(52) U.S. Cl. ..................... 709/246; 709/236; 709/249
(58) Field of Classification Search .................. 709/223, 709/227, 236, 246, 249
  See application file for complete search history.

(56) References Cited

U.S. PATENT DOCUMENTS

| 5,859,707 | A | 1/1999 | Nakagawa et al. |
| 6,421,733 | B1 * | 7/2002 | Tso et al. ..................... 709/246 |
| 2001/0002470 | A1 * | 5/2001 | Inohara et al. ..................... 707/1 |
| 2003/0022396 | A1 | 1/2003 | Ogawa |
| 2003/0171885 | A1 | 9/2003 | Coss, Jr. et al. |
| 2005/0015165 | A1 | 1/2005 | Naya et al. |
| 2005/0091311 | A1 * | 4/2005 | Lund et al. ..................... 709/203 |

FOREIGN PATENT DOCUMENTS

| JP | A-05-20332 | 1/1993 |
| JP | A 05-020332 | 1/1993 |
| JP | A 06-124873 | 5/1994 |
| JP | A 07-302826 | 11/1995 |
| JP | A-07-302826 | 11/1995 |
| JP | A 09-219354 | 8/1997 |

(Continued)

OTHER PUBLICATIONS

International Search Report issued on counterpart PCT Patent Appln. No. PCT/JP2006/321383 on Nov. 21, 2006 w/English translation.

(Continued)

*Primary Examiner* — Larry Donaghue
(74) *Attorney, Agent, or Firm* — Oliff & Berridge, PLC

(57) ABSTRACT

A communication server connects together device manufacturing processing apparatuses such as exposure apparatuses and various inspection apparatuses and the like. This communication server is provided with a file format conversion section that converts the format of data exchanged between device manufacturing processing apparatuses, a communication message conversion section that converts communication messages, and a communication protocol conversion section that converts communication protocols. The communication server receives information transmitted from a transmission source compatibly with a device manufacturing processing apparatus which is the transmission source, and transmits the received information compatibly with a device manufacturing processing apparatus that is a destination of the transmission.

43 Claims, 8 Drawing Sheets

FOREIGN PATENT DOCUMENTS

| | | |
|---|---|---|
| JP | A 09-320956 | 12/1997 |
| JP | A 10-303114 | 11/1998 |
| JP | A-2001-154931 | 6/2001 |
| JP | A-2001-184324 | 7/2001 |
| JP | A 2003-037051 | 2/2003 |
| JP | A 2005-033013 | 2/2005 |
| JP | A 2005-520324 | 7/2005 |
| WO | WO 95/31003 | 11/1995 |
| WO | WO 99/49504 | 9/1999 |

OTHER PUBLICATIONS

Written Opinion issued on counterpart PCT/JP2006/321383 on Nov. 21, 2006 w/English translation.

Sep. 27, 2011 Office Action issued in JP Application No. 2007-542657 (with English translation).

* cited by examiner

```
<CONVERSION RECIPE FILE NUMBER>
            CONNECTED DEVICE NAMES:
    EXPOSURE APPARATUS 13 ⇔ INSPECTION APPARATUS D1

[FILE FORMAT CONVERSION DEFINITION FILE NAME]
[COMMUNICATION MESSAGE CONVERSION DEFINITION FILE NAME]
[COMMUNICATION PROTOCOL CONVERSION DEFINITION FILE NAME]
```

```
<CONVERSION RECIPE FILE NUMBER>
            CONNECTED DEVICE NAMES:
    EXPOSURE APPARATUS 13 <=> INSPECTION APPARATUS D1

[FILE FORMAT CONVERSION PROGRAM NAME]
[COMMUNICATION MESSAGE CONVERSION PROGRAM NAME]
[COMMUNICATION PROTOCOL CONVERSION PROGRAM NAME]
```

DEVICE AND METHOD FOR CONNECTING DEVICE MANUFACTURING PROCESSING APPARATUSES, PROGRAM, DEVICE MANUFACTURING PROCESSING SYSTEM, EXPOSURE APPARATUS AND METHOD, AND MEASUREMENT AND INSPECTION APPARATUS AND METHOD

CROSS-REFERENCE TO RELATED APPLICATION

This application is non-provisional application claiming benefit of provisional application No. 60/738,570, filed Nov. 22, 2005, and claims priority to Japanese Patent Application No. 2005-314759, filed on Oct. 28, 2005, the contents of which are incorporated herein by reference.

BACKGROUND OF THE INVENTION

1. Field of the Invention

The present invention relates to a connection device and a connection method for connecting device manufacturing processing apparatuses that are used for manufacturing devices, and to a program, a device manufacturing processing system, an exposure apparatus and an exposure method, as well as to a measurement and inspection apparatus and a measurement and inspection method.

2. Description of Related Art

Semiconductor devices, liquid crystal display devices, image pickup devices (such as charge coupled devices (CCD) and the like) thin film magnetic heads, and other devices are manufactured by performing various types of processing on a substrate using a device manufacturing processing apparatus. Processing performed by the device manufacturing processing apparatus on a substrate includes, for example, thin film formation processing, photolithographic processing, and impurity dispersion processing and the like. There is also processing to measure and inspect a pattern formed on a substrate that has undergone these processings.

In the aforementioned thin film formation processing, film formation processing is performed in which a thin film is formed on a substrate using, for example, a chemical vapor deposition (CVD) apparatus which is a type of device manufacturing processing apparatus. In the aforementioned photolithographic processing, exposure processing is performed in which a predetermined pattern is transferred onto a substrate using an exposure apparatus which is a type of device manufacturing processing apparatus. In the aforementioned pattern measurement and inspection processing, the line width of a pattern formed on a substrate is measured or, alternatively, defects in a pattern formed on a substrate are inspected using, for example, a measurement and inspection apparatus which is a type of device manufacturing processing apparatus.

Generally, a network such as a local area network (LAN) is set up in a device manufacturing plant. Various device manufacturing processing apparatuses and a host computer that controls these apparatuses are mutually connected through this network. The host computer controls operations of the device manufacturing processing apparatuses by sending control signals to the device manufacturing processing apparatuses via the network. As a result, various processings are performed on the aforementioned substrate in a predetermined sequence resulting in a device being manufactured. Note that the above described contents are known public technologies and do not include any prior art document information requiring to be disclosed.

When, however, the aforementioned device manufacturing processing apparatuses perform a particular processing, there are cases when information used by other device manufacturing processing apparatuses, or information showing processing results obtained by other device manufacturing processing apparatuses is required. For example, when the line width and the like of a pattern formed on a substrate that has been exposed using the aforementioned exposure apparatus are measured using the aforementioned measurement and inspection apparatus, information showing the pattern that should have been formed on the substrate and information showing the kind of conditions in which the substrate was exposed are required.

A number of manufacturers produce device manufacturing processing apparatuses and there is no standardization of the information formats used in the device manufacturing processing apparatuses. Moreover, when transferring information between device manufacturing processing apparatuses, it is necessary to use identical communication control information (i.e., communication messages) and communication procedures (i.e., communication protocols) between communicating device manufacturing processing apparatuses, however, these are also not standardized. As a result, conventionally, if information used by other device manufacturing processing apparatuses or information obtained by other device manufacturing processing apparatuses becomes necessary while particular processing is being performed by a particular device manufacturing processing apparatus, an operator has to manually acquire individual items of information that are needed from the other device manufacturing processing apparatuses, and to manually execute of conversion of the information. Consequently, the problem arises that information is not effectively used between device manufacturing processing apparatuses.

SUMMARY OF THE INVENTION

It is an object of the present invention to provide a connection device and a connection method for connecting together device manufacturing processing apparatuses that make it possible to effectively utilize information between device manufacturing processing apparatuses, and also a program, a device manufacturing processing system, an exposure apparatus and an exposure method, as well as a measurement and inspection apparatus and a measurement and inspection method.

A connecting device for connecting together device manufacturing apparatuses of the present invention is a connection device that connects together two or more device manufacturing processing apparatuses and includes: a receiving section that is connected to a first device manufacturing processing apparatus and receives information sent from the first device manufacturing processing apparatus using a method that is suitable for receiving information sent from the first device manufacturing processing apparatus; a conversion section that is connected to the receiving section and converts information received by the receiving section into information that is suitable for information receiving by a second device manufacturing processing apparatus that is different from the first device manufacturing processing apparatus; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus.

According to this invention, when information is transmitted from a first device manufacturing processing apparatus, this transmitted information is received by a receiving section of a connection device using a method that is suitable for receiving the information. The received information is then converted by a conversion section into information that is suitable for being received by a second device manufacturing processing apparatus, and this converted information is then transmitted via a transmitting section to the second device manufacturing processing apparatus.

A connection method for connecting together device manufacturing processing apparatuses of the present invention is a connection method for connecting together two or more device manufacturing processing apparatuses in which information transmitted from a first device manufacturing processing apparatus is received compatibly with the first device manufacturing processing apparatus, and the received information is transmitted compatibly with a second device manufacturing processing apparatus that is a destination of the transmission.

A program of the present invention is a program that causes at least a portion of information communication processing between two or more device manufacturing processing apparatuses to be executed on a computer, wherein the program causes processing to be executed in which information transmitted from a first device manufacturing processing apparatus is received compatibly with the first device manufacturing processing apparatus, and in which the received information is transmitted compatibly with a second device manufacturing processing apparatus that is a destination of the transmission.

A device manufacturing processing system of the present invention includes: a first device manufacturing processing apparatus; a second device manufacturing processing apparatus; and a connection device that connects together the first device manufacturing processing apparatus and the second device manufacturing processing apparatus, wherein the connection device includes: a receiving section that is connected to the first device manufacturing processing apparatus and receives information sent from the first device manufacturing processing apparatus using a method that is suitable for receiving information sent from the first device manufacturing processing apparatus; a conversion section that is connected to the receiving section and converts information received by the receiving section into information that is suitable for information receiving by the second device manufacturing processing apparatus; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus.

An exposure apparatus of the present invention is connected to a connection device which connects together device manufacturing processing apparatuses and is provided with: a receiving section that is connected to a first device manufacturing processing apparatus and receives information sent from the first device manufacturing processing apparatus using a method that is suitable for receiving information sent from the first device manufacturing processing apparatus; a conversion section that is connected to the receiving section and converts information received by the receiving section into information that is suitable for information receiving by a second device manufacturing processing apparatus that is different from the first device manufacturing processing apparatus; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, and the exposure apparatus transfers a predetermined pattern onto a substrate by exposure.

In an exposure method of the present invention, an exposure to transfer a predetermined pattern onto a substrate is made using the above described exposure apparatus.

A measurement and inspection apparatus of the present invention is connected to a connection device which connects together device manufacturing processing apparatuses and which is provided with: a receiving section that is connected to a first device manufacturing processing apparatus and receives information sent from the first device manufacturing processing apparatus using a method that is suitable for receiving information sent from the first device manufacturing processing apparatus; a conversion section that is connected to the receiving section and converts information received by the receiving section into information that is suitable for information receiving by a second device manufacturing processing apparatus that is different from the first device manufacturing processing apparatus; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, and the measurement and inspection apparatus performs at least one of a predetermined measurement and inspection of a substrate.

In a measurement and inspection method of the present invention, at least one of a predetermined measurement or inspection of a substrate is made using the above described measurement and inspection apparatus.

According to the present invention, because information transmitted from a device manufacturing processing apparatus is received compatibly with the device manufacturing processing apparatus that is the transmission source of the relevant information, and the received information is transmitted compatibly with a device manufacturing processing apparatus that is a destination of the transmission, the effect is obtained that it is possible to effectively utilize information between device manufacturing processing apparatuses.

DETAILED DESCRIPTION OF THE INVENTION

A connection device and connection method for connecting together device manufacturing processing apparatuses, a program, a device manufacturing processing system, an exposure apparatus and exposure method, as well as a measurement and inspection apparatus and measurement and inspection method according to an embodiment of the present invention will now be described in detail with reference made to the drawings. In the description below, an overall structure of the device manufacturing processing system, structures of the apparatuses forming the device manufacturing processing system, and a device manufacturing method that uses the device manufacturing processing system will be described in sequence.

[Device Manufacturing Processing System]

Figure 1:
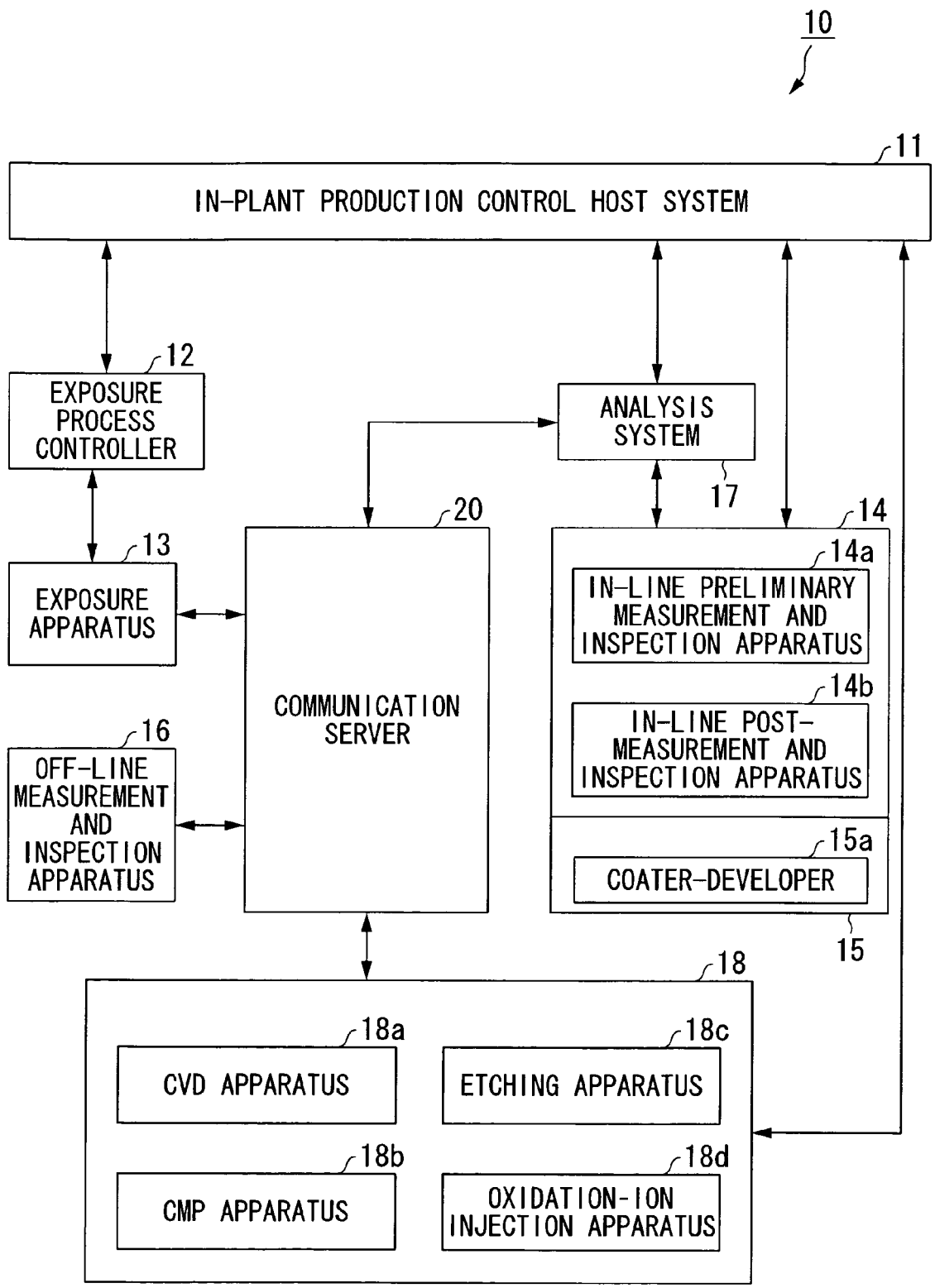
FIG. 1 is a block diagram showing the schematic structure of a device manufacturing processing apparatus according to an embodiment.

FIG. 1 is a block diagram showing the schematic structure of a device manufacturing processing system according to an embodiment of the present invention. As is shown in FIG. 1, a device manufacturing processing system 10 of the present embodiment includes an in-plant production control host system 11 that serves as a host computer, an exposure process controller 12, an exposure apparatus 13, an in-line measurement and inspection apparatus 14, a truck 15, an off-line measurement and inspection apparatus 16, an analysis system 17, a substrate processing apparatus 18, and a communication server 20. This device manufacturing processing system 10 is provided inside a device manufacturing plant.

The in-plant production control host system 11 through to the substrate processing apparatus 18 are mutually connected via a network (i.e., a connection network) such as a local area network (LAN) that is set up within the device manufacturing plant. The exposure apparatus 13, in-line measurement and inspection apparatus 14, truck 15, off-line measurement and inspection apparatus 16, analysis system 17, and substrate processing apparatus 18 that serve as device manufacturing processing apparatuses that make up the aforementioned device manufacturing processing system 10 are connected to the communication server 20.

The in-plant production control system 11 controls as a single block via a network set up within the device manufacturing plant the various device manufacturing processing apparatuses (i.e., the exposure apparatus 13, in-line measurement and inspection apparatus 14, truck 15, off-line measurement and inspection apparatus 16, analysis system 17, and substrate processing apparatus 18) that are provided within the device manufacturing plant. The exposure processing controller 12 controls the exposure apparatus 13 under the control of the in-plant production control system 11. Although FIG. I is a simplified view thereof, a plurality of exposure apparatuses 13 are provided in the device manufacturing plant, and the exposure processing controller 12 controls each of the exposure apparatuses 13.

The exposure apparatuses 13 perform the exposure transfer of a predetermined pattern onto a substrate such as a wafer that has been coated with a photosensitive material such as photoresist or a glass substrate or the like. Examples of the exposure apparatuses 13 include a single exposure type of projection exposure apparatus (i.e., a static type of exposure apparatus) such as a stepper that makes an exposure while a mask stage that holds a mask on which a predetermined pattern has been formed and a substrate stage that holds a substrate are placed in a predetermined positional relationship, and a scanning exposure type of projection exposure apparatus (i.e., a scanning type of exposure apparatus) such as a scanning stepper that makes an exposure while a mask stage and substrate stage are moved in synchronization (i.e., are scanned) relatively to each other. Note that a detailed description of the exposure apparatus 13 is given below.

The in-line measurement and inspection apparatus 14 and truck 15 are provided in-line for each exposure apparatus 13. The in-line measurement and inspection apparatus 14 is provided with an in-line preliminary measurement and inspection apparatus 14a and an in-line post-measurement and inspection apparatus 14b. The in-line preliminary measurement and inspection apparatus 14a measures the surface condition and the like (for example, any height irregularities in patterns already formed on the substrate) of a substrate to be exposed prior to the exposure processing by the exposure apparatus 13, or makes a preliminary measurement of alignment marks (i.e., performs alignment measurement) formed on the substrate. The measurement and inspection results of the in-line preliminary measurement and inspection apparatus 14a are sent via the communication server 20 to the exposure apparatus 13 and are used to optimize exposure conditions for the substrate to be exposed. Namely, measurement and inspection results from the in-line preliminary measurement and inspection apparatus 14a are fed forward to the exposure apparatus 13 and are used to optimize the exposure conditions for the exposure apparatus 13.

The in-line post-measurement and inspection apparatus 14b, for example, measures the overlay and line widths and the like of patterns formed on a substrate by the exposure processing of the exposure apparatus 13. The measurement and inspection results from this in-line post-measurement and inspection apparatus 14b are also sent via the communication server 20 to the exposure apparatus 13 and are used to optimize exposure conditions for substrates to be subsequently exposed. Namely, measurement and inspection results from the in-line post-measurement and inspection apparatus 14b are fed back to the exposure apparatus 13 and are used to optimize the exposure conditions for the exposure apparatus 13.

The truck 15 is an apparatus that transports a substrate towards or away from the exposure apparatus 13. In the present embodiment, a coater/developer 15a is provided on the truck 15. The coater/developer 15a coats a photosensitive material such as photoresist onto substrates that are to undergo exposure processing by the exposure apparatus 13, and also develops substrates that have already undergone exposure processing by the exposure apparatus 13. Namely, substrates that are to undergo exposure processing are first coated with a photosensitive material by the coater/developer 15a, and are then transported by the truck 15 to the exposure apparatus 13. Substrates that have undergone exposure processing are transported out from the exposure apparatus 13 by the truck 15 and are developed by the coater/developer 1 Sa.

The off-line measurement and inspection apparatus 16 is an off-line apparatus that is provided independently from the exposure apparatus 13 and, for example, measures or inspects the overlay accuracy and line width of patterns that have been formed by the exposure processing of the exposure apparatus 13. Note that, in this off-line measurement and inspection apparatus 16, there may be cases in which only various types of measurement or only various types of inspection are performed, and there may also be cases in which various types of measurement and various types of inspection are performed together. Hereinafter, in the present specification, both measurements and inspections are referred to together under the generic term 'measurement and inspection'. When 'measurement and inspection' are referred to in the present specification, this may include cases in which only measurement is performed or cases in which only inspection is performed. The analysis system 17 performs various types of analysis or simulations using various types of data obtained from the exposure apparatus 13 or using various measurement and inspection results obtained from the off-line measurement and inspection apparatus 16. For example, a predicted line width of a pattern formed on a substrate is determined by simulation using various types of data showing exposure conditions obtained from the exposure apparatus 13.

The substrate processing apparatus 18 performs predetermined processing on a substrate. In FIG. 1, a chemical vapor deposition (CVD) apparatus 18a, a chemical mechanical polishing (CMP) apparatus 18b, an etching apparatus 18c, and an oxidation/ion injection apparatus 18d are shown as examples of the substrate processing apparatus 18. The CVD apparatus 18a is a film forming apparatus that forms a thin film on a substrate. The CMP apparatus 18b is a polishing apparatus that flattens a surface of a substrate by chemical mechanical polishing. The etching apparatus 18c etches a substrate. The oxidation/ion injection apparatus 18d forms an oxidation film on a substrate surface or injects impurities into predetermined positions on a substrate.

The communication server 20 mutually connects the device manufacturing processing apparatuses (i.e., the exposure apparatus 13, the in-line measurement and inspection apparatus 14, the truck 15, the off-line measurement and inspection apparatus 16, the analysis system 17, and the substrate processing apparatus 18). As is described above, these device manufacturing processing apparatuses are mutually connected via a network that is set up within a device manufacturing plant, however, in the present embodiment, they are additionally mutually connected via the communication server 20.

The reason why the respective device manufacturing processing apparatuses are mutually connected using the communication server 20 in addition to the network set up within the device manufacturing plant is because a number of manufacturers produce device manufacturing processing apparatuses, and there are no standardized information format, communication control information (i.e., communication messages), and communication procedures (i.e., communication protocols) that are handled by the device manufacturing processing apparatuses. In addition, an enormous amount of data is obtained by the respective device manufacturing processing apparatuses, and if this data is communicated solely via a network, the load on the network is considerable and there is a possibility that delays will occur in the device manufacturing processing.

The communication server 20 absorbs any differences between information formats, communication messages, and communication protocols handled by the respective device manufacturing processing apparatuses, and mutually connects the respective device manufacturing processing apparatuses. Note that a detailed description of this communication server 20 is given below. The overall structure of the device manufacturing processing system according to an embodiment of the present invention has been described above. Next, a detailed description will be given of the exposure apparatus 13 and communication server 20 that make up the device manufacturing processing system in that sequence.

[Exposure Apparatus]

Figure 2:
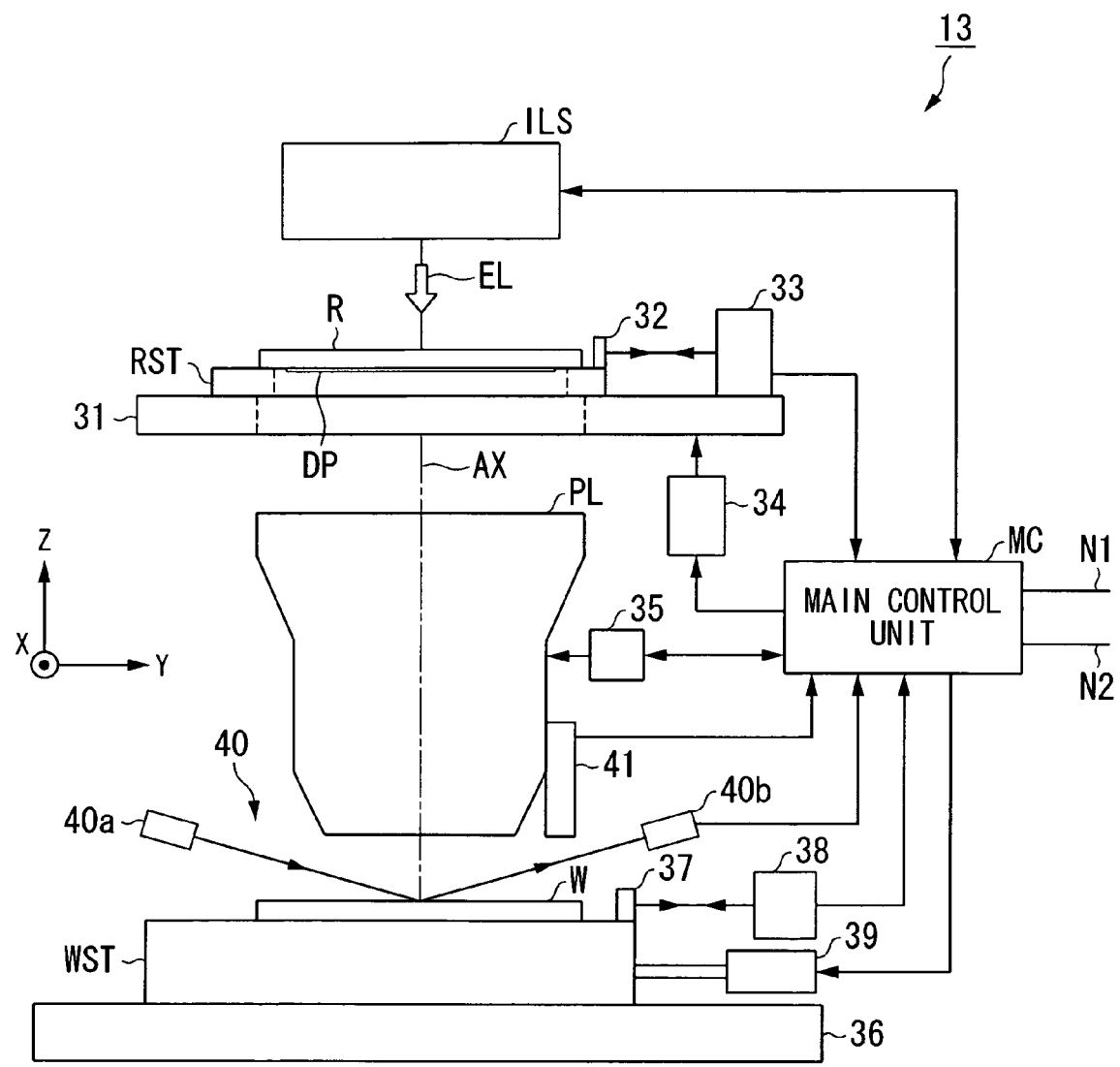
FIG. 2 is a side view showing the schematic structure of an exposure apparatus which is a type of device manufacturing processing apparatus according to an embodiment.

FIG. 2 is a side view showing the schematic structure of an exposure apparatus which is a type of device manufacturing processing apparatus according to an embodiment of the present invention. In FIG. 2, a step-and-scan mode reduced size projection type of exposure apparatus for manufacturing semiconductor devices is used as an example. This exposure apparatus sequentially transfers a pattern DP that is formed on a reticle R that serves as a mask onto a wafer W that serves as a substrate while moving the reticle R and the wafer W in synchronization. Note that, in the description given below, if required, an XYZ rectangular coordinate system is set in the drawings and positional relationships of the respective components are described with reference to this XYZ rectangular coordinate system. In this XYZ rectangular coordinate system, the XY plane is set as a surface that is parallel with a horizontal plane, while the Z axis is set to a perpendicularly upward direction. The direction of synchronized movement (i.e., the scan direction) of the reticle R and the wafer W during an exposure is set as the Y direction.

The exposure apparatus 13 shown in FIG. 2 includes an illumination optical system ILS that illuminates a slit-shaped (i.e., a rectangular-shaped or arc-shaped) illumination area that extends in the X direction (i.e., a second direction) on a reticle R using exposure light EL having a uniform illumination intensity, a reticle stage RST that holds the reticle R, a projection optical system PL that projects an image of a pattern DP of a reticle R onto a wafer W that has been coated with photoresist, a wafer stage WST that holds the wafer W, and a main control unit MC that controls these components.

The illumination optical system ILS includes a light source unit, an illumination intensity standardizing optical system that includes an optical integrator, a beam splitter, a condensing lens system, a reticle blind, and an imaging lens system and the like (each is omitted from the drawings). The structure and the like of this illumination optical system is disclosed, for example, in Japanese Unexamined Patent Application, Publication No. H09-320956. Here, the aforementioned light source unit may be formed by a KrF excimer laser (having a wavelength of 248 nm), an ArF excimer laser (having a wavelength of 193 nm), or an ultraviolet laser light source such as an $F_2$ laser light source (having a wavelength of 157 nm), a $Kr_2$ laser light source (having a wavelength of 146 nm), an $Ar_2$ laser light source (having a wavelength of 126 nm), a copper vapor laser light source, a harmonic generator light source such as a YAG laser, a solid state laser (such as a semiconductor laser) harmonic generator, or a mercury lamp (g-ray, h-ray, or i-ray or the like).

The reticle stage RST holds a reticle R by vacuum suction or electrostatic adhesion or the like and is constructed so as to be able to move in a predetermined stroke in a scanning direction (i.e., the Y direction) on a top surface of a reticle supporting base (i.e., surface plate) 31 that is aligned horizontally below the illumination optical system (i.e., the—Z direction). This reticle stage RST is also constructed so as to be able to be driven precisely relative to the reticle supporting base 31 in the X direction, Y direction, and a rotational direction around the Z axis (i.e., a θ Z direction).

A movable mirror 32 is provided at one end on the reticle stage RST. A laser interferometer (referred to below as a 'reticle interferometer' 33 is placed on the reticle supporting base 31. The reticle interferometer 33 detects the position in the X direction, the Y direction, and the-rotational direction around the Z axis (i.e., the θZ direction) of the reticle stage RST by irradiating laser light onto a mirror surface of the movable mirror 32 and then receiving reflected light therefrom. Position information about the reticle stage RST that is detected by the reticle interferometer 33 is supplied to the main control unit MC that exercises general control over the operations of the apparatus as a whole. The main control unit MC controls operations of the reticle stage RST via a reticle drive apparatus 34 that drives the reticle stage RST.

A dioptric system that includes a plurality of dioptric elements (i.e., lens elements) and has a predetermined reduction factor β (wherein β is, for example, ¼, ⅕, or the like) with both an object surface (i.e., the reticle R) side and an image surface (i.e., the wafer W) side being telecentric is used for the aforementioned projection optical system PL. The direction of an optical axis AX of this projection optical system PL is set as the Z direction which is orthogonal to the XY plane. Note that, in accordance with the wavelength of the exposure light EL, for example, quartz or fluorite is used for the material of the plurality of lens elements provided in the projection optical system PL. In the present embodiment a description using as an example a projection optical system PL that projects an inverted image of a pattern DP that is formed on a reticle R onto a wafer W, however, the projection system that projects a normal image of the pattern DP may also be used.

A lens controller section 35 that measures temperature and atmospheric pressure, and that controls optical characteristics, such as the imaging characteristics of the projection optical system PL, in accordance with environmental changes in temperature and atmospheric pressure and the like so that they remain constant is provided in the projection optical system PL. Measurement results for the temperature and atmospheric pressure from the lens controller section 35 are output to the main control unit MC. Based on the measurement results for the temperature and atmospheric pressure that are output from the lens controller section 35, the main control unit MC controls optical characteristics such as the imaging characteristics of the projection optical system PL via the lens controller section 35.

The wafer stage WST is positioned below (i.e., in the—Z direction) the projection optical system PL and holds a wafer W by vacuum suction or electrostatic adhesion. This wafer stage WST is constructed so as to be able to move in a predetermined stroke in a scanning direction (i.e., the Y direction) on a top surface of a wafer supporting base (i.e., surface plate) 36, and is also constructed so as to be able to make step movements in the X direction and Y direction, and so as to also be able to make precise movements in the Z direction (including rotating around the X axis and rotating around the Y axis). A wafer W can be moved in the X direction and the Y direction by this wafer stage WST, and the position and attitude (i.e. the rotation thereof around the X axis and around the Y axis) of the wafer W in the Z direction can be adjusted.

A movable mirror 37 is provided at one end of the wafer stage WST. A laser interferometer (referred to below as a wafer interferometer) 38 that irradiates laser light onto a mirror surface (i.e., a reflective surface) of the movable mirror 37 is provided lateral to the wafer stage WST. This wafer interferometer 38 detects the position in the X direction and the Y direction and also the attitude (i.e., the rotations θX, θY, and θZ around the X axis, the Y axis and the Z axis) of the wafer stage WST by irradiating laser light onto a mirror surface of the movable mirror 37 and then receiving reflected light therefrom. Detection results from the wafer interferometer 38 are supplied to the main control unit MC. The main control unit MC controls the position and attitude of the wafer stage WST via a wafer drive apparatus 39 based on detection results from the wafer interferometer 38.

In the exposure apparatus 13 of the present embodiment, a multipoint AF sensor 40 is provided at the side of the projection optical system PL. This AF sensor 40 is formed by a light transmitting system 40a and a light receiving system 40b and the like, and detects a position in the Z direction (i.e., the direction of the optical axis AX) of the surface of a wafer W at each of a plurality of detection points. The AF sensor 40 also detects the surface position and attitude (i.e., the rotations θX and θY around the X axis and Y axis:—leveling) of a wafer W in the direction of the optical axis AX of the projection optical system PL. The plurality of detection points are set to interior portions of exposure slit areas on a wafer W that are conjugate with an illumination area on the reticle R for the projection optical system PL and also to vicinities thereof.

Detection results from this AF sensor 40 are supplied to the main control unit MC. The main control unit MC controls the position and attitude of the wafer stage WST via the wafer drive apparatus 39 based on the detection results from the AF sensor 40. Specifically, a reference surface (referred to below as an AF surface) is set in advance in the main control unit MC that provides a reference for positioning the surface of the wafer W. Based on detection results from the AF sensor 40, the main control unit MC controls the position and attitude of the wafer stage WST such that the surface of a wafer W matches the AF surface.

In the exposure apparatus 13 of the present embodiment, an image processing off-axis type of alignment sensor 41 is positioned at a side surface in the Y direction of the projection optical system PL. The alignment sensor 41 monitors alignment marks that are attached to a shot area that is set on a wafer W. Monitored results (measurement results) from the alignment sensor 41 are supplied to the main control unit MC. An optical axis of the optical system of the alignment sensor 41 is parallel with the optical axis AX of the projection optical system PL. The structure of this type of alignment sensor 41 is described in detail, for example, in Japanese Unexamined Patent Application, First Publication No. H09-219354 and in the corresponding U.S. Pat. No. 5,859,707. The main control unit MC performs EGA measurements using measurement results from the alignment sensor 41. EGA measurements employ a method in which predetermined statistical computations (i.e., EGA computations) are made using measurement results from a representative number of alignment marks formed on a wafer W, and the arrangement of all the shot areas set on the wafer W is then determined.

The main control unit MC is connected to the exposure process controller 12 shown in FIG. 1 via a network N1, and executes exposure processing in accordance with an exposure recipe (i.e., exposure control information) that is transmitted from the exposure process controller 12 via the network N1. The main control unit MC is also connected to the communication server 20 shown in FIG. 1 via a connecting wire N2. When measurement and inspection results from the in-line preliminary measurement and inspection apparatus 14a or the in-line post-measurement and inspection apparatus 14b are transmitted via the communication server 20, the main control unit MC performs control so as to optimize exposure conditions using these measurement and inspection results.

[Communication Server]

Figure 3:
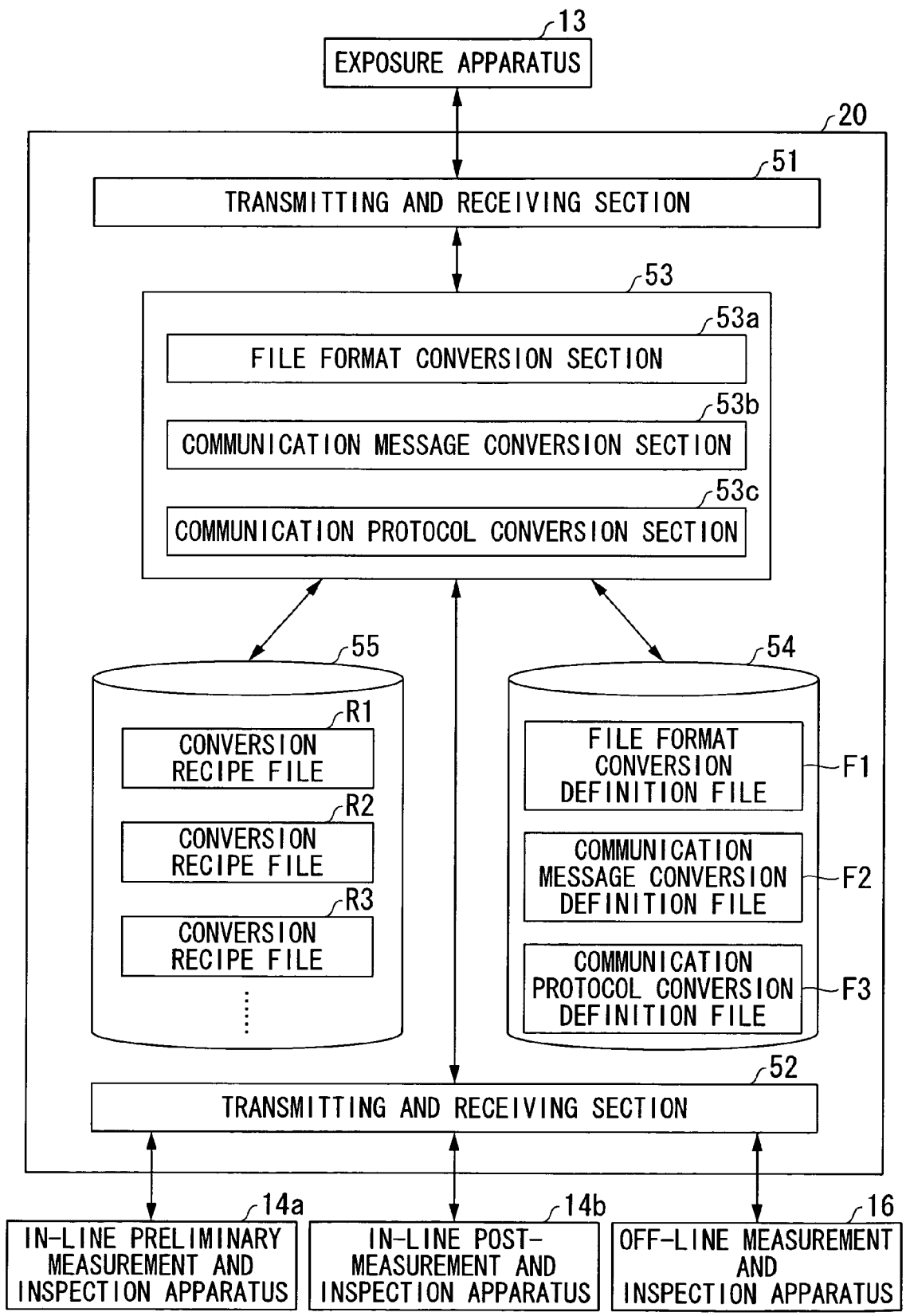
FIG. 3 is a block diagram showing the structure of a communication server that serves as a connection device between device manufacturing processing apparatuses according to an embodiment.

FIG. 3 is a block diagram showing the structure of a communication server that serves as a connecting device for connecting together device manufacturing processing apparatuses according to an embodiment of the present invention. As is shown in FIG. 3, the exposure apparatus 13, the in-line preliminary measurement and inspection apparatus 14a, the in-line post-measurement and inspection apparatus 14b, and the off-line measurement and inspection apparatus 16 are connected to the communication server 20. In addition to the exposure apparatus 13, the in-line measurement and inspection apparatus 14 (i.e., the in-line preliminary measurement and inspection apparatus 14a and the in-line post-measurement and inspection apparatus 14b), and the off-line measurement and inspection apparatus 16, as is described above, the truck 15, analysis system 17, and substrate processing apparatus 18 are also connected to the communication server 20, however, in FIG. 3, these are omitted from the drawing. In the explanation below, descriptions of the connections from the truck 15, analysis system 17, and substrate processing apparatus 18 are omitted in order to simplify the explanation.

The communication server 20 includes transmitting and receiving sections 51 and 52, a conversion section 53, a conversion definition file registration section 54, and a conversion recipe registration section 55. The transmitting and receiving section 51 is connected to the exposure apparatus 13 via the connecting wire N2 shown in FIG. 2. The transmitting and receiving section 51 receives information that is transmitted from the main control unit MC of the exposure apparatus 13 via the connecting wire N2, and also transmits via the connecting wire N2 information that needs to be transmitted to the main control unit MC. Here, the transmitting and receiving section 51 is provided with a connection interface that is suitable for connecting the exposure apparatus 13. For example, if the connecting wire (see FIG. 2) that is connected to the exposure apparatus 13 is provided with an RJ-45 connector, then a connection interface is provided into which this connector is inserted. Because of this, when the transmitting and receiving section 51 receives a variety of information that is sent from the main control unit MC of the exposure apparatus 13, the information is received using a method appropriate for each individual reception.

The transmitting and receiving section 52 is connected to the in-line preliminary measurement and inspection apparatus 14a, the in-line post-measurement and inspection apparatus 14b, and the off-line measurement and inspection apparatus 16. The transmitting and receiving section 52 receives information that is transmitted from these and also transmits information that needs to be transmitted to them. Here, the transmitting and receiving section 52 is provided with a connection interface that is suitable for connecting the in-line preliminary measurement and inspection apparatus 14a, the in-line post-measurement and inspection apparatus 14b, and the off-line measurement and inspection apparatus 16. For example, if the in-line preliminary measurement and inspection apparatus 14a, the in-line post-measurement and inspection apparatus 14b, and the off-line measurement and inspection apparatus 16 are provided with an RS-232C Standard connection interface, then this connection interface is also provided in the transmitting and receiving section 52. Because of this, when the transmitting and receiving section 52 receives a variety of information that is sent from the in-line preliminary measurement and inspection apparatus 14a, the in-line post-measurement and inspection apparatus 14b, and the off-line measurement and inspection apparatus 16, the information is received using a method appropriate for each individual reception. Note that, in FIG. 3, for convenience, two transmitting and receiving sections, namely, the transmitting and receiving section 51 to which the exposure apparatus 13 is connected and the transmitting and receiving section 52 to which the in-line preliminary measurement and inspection apparatus 14a, the in-line post-measurement and inspection apparatus 14b, and the off-line measurement and inspection apparatus 16 are connected are shown, however, it should be noted that a transmitting and receiving section is provided for each device manufacturing processing apparatus that is connected to the communication server 20 and each of the transmitting and receiving sections is connected to the conversion section 53.

The conversion section 53 is connected to the transmitting and receiving sections 51 and 52 and converts information received by the transmitting and receiving section 51 into predetermined information and outputs it to the transmitting and receiving section 52. The conversion section 53 also converts information received by the transmitting and receiving section 52 into predetermined information and outputs it to the transmitting and receiving section 51. Here, the type of information into which the information received by the transmitting and receiving section 51 or the information received by the transmitting and receiving section 52 is to be converted differs depending on the recipient to whom the particular information is to be sent. For example, if information generated by the exposure apparatus 13 is to be sent to the in-line preliminary measurement and inspection apparatus 14a, the conversion section 53 converts the information received by the transmitting and receiving section 51 into information that is suitable for being received by the in-line preliminary measurement and inspection apparatus 14a. In contrast, if the same information generated by the exposure apparatus 13 is to be sent to the in-line post-measurement and inspection apparatus 14b, the conversion section 53 converts the information received by the transmitting and receiving section 51 into information that is suitable for being received by the in-line post-measurement and inspection apparatus 14b.

As is shown in FIG. 3, the conversion apparatus 53 includes a file format conversion section 53a, a communication message conversion section 53b, and a communication protocol conversion section 53c. The file format conversion section 53a converts the format of information received by the transmitting and receiving sections 51 and 52 into a format that is suitable for processing by the device manufacturing processing apparatus that is to be the recipient of that information. The communication message conversion section 53b converts communication messages used by the device manufacturing processing apparatus that is the transmission source of the information into communication messages that are recognizable by the device manufacturing and processing apparatus that is to be the recipient of that information.

The communication protocol conversion section 53c converts information received using the communication protocol that is used by the device manufacturing processing apparatus that is the transmission source of the information into information transmitted in a communication protocol that is suitable for reception by the device manufacturing processing apparatus that is to be the recipient of that information. For example, in the exposure apparatus 13, HSMS which is regulated by the SEMI semiconductor manufacturing apparatus standard is used as the communication protocol. In the in-line preliminary measurement and inspection apparatus 14a, the in-line post-measurement and inspection apparatus 14b, and the off-line measurement and inspection apparatus 16, when SECS-I which is regulated by the same standard is used as the communication protocol, conversion of these communication protocols is performed. Note that the aforementioned HSMS is a communication protocol that is used by Ethernet (registered Trademark), while SECS-I is a communication protocol that is used in the RS-232C Standard.

As is described above, the conversion processing that is performed by the conversion section 53 differs for each combination of information transmission source device manufacturing processing apparatus and information recipient device manufacturing processing apparatus. As a result, in the present embodiment, the conversion rules for information that is sent or received between any two device manufacturing processing apparatuses from among the plurality of device manufacturing processing apparatuses that are connected to the communication server 20 are defined as a conversion definition file. A plurality of these conversion definition files are registered in file format in the conversion definition file registration section 54.

As is shown in FIG. 3, file format conversion definition files F1 in which the conversion rules that are used by the file format conversion section 53a are defined are registered in the conversion definition file registration section 54 as are communication message conversion definition files F2 in which the conversion rules that are used by the communication message conversion section 53b are defined, and communication protocol conversion definition files F3 in which the conversion rules that are used by the communication protocol conversion section 53c are defined. The file format conversion definition files F1, the communication message conversion definition files F2, and the communication protocol conversion definition files F3 are registered in the conversion definition file registration section 54 using file names that are uniquely determined.

For example, the file format conversion definition files F1 are registered using the file names "A1.txt", "A2.txt", "A3.txt", . . . , the communication message conversion definition files F2 are registered using the file names "B1.txt", "B2.txt", "B3.txt", . . . , and the communication protocol conversion definition files F3 are registered using the file names "C1.txt", "C2.txt", "C3.txt", . . . , . All of the file format conversion definition files F1, the communication message conversion definition files F2, and the communication protocol conversion definition files F3 are text files, and a user is able to freely alter the contents thereof.

Figure 4:
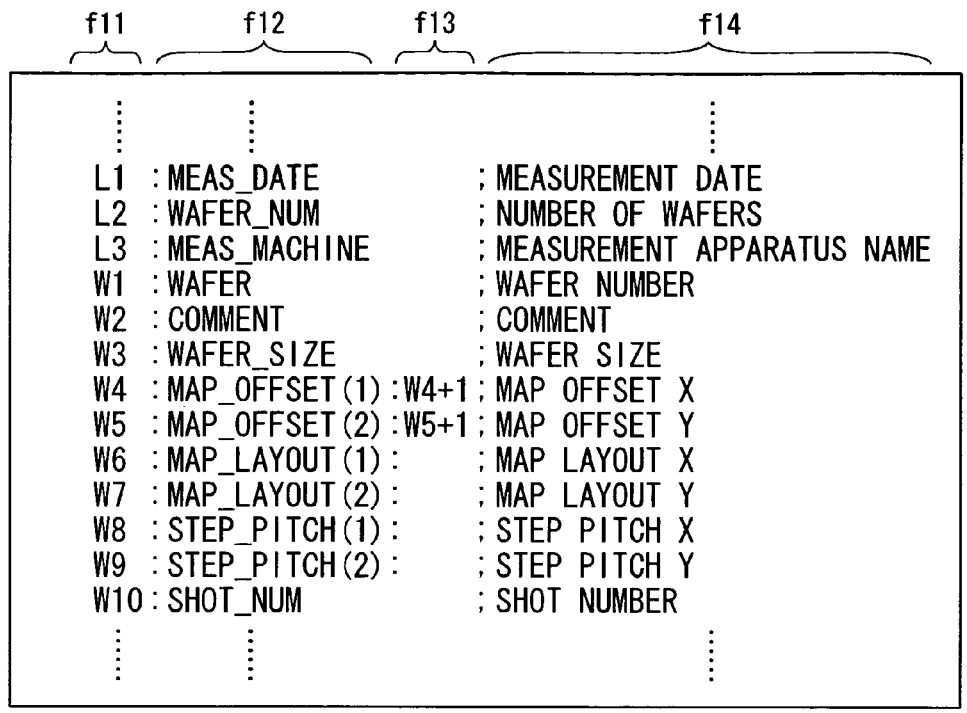
FIG. 4 is a view showing an example of contents of a file format conversion definition file.

FIG. 4 is a view showing an example of contents of the file format conversion definition file F1. The file format conversion definition file F1 shown in FIG. 4 is a portion of a conversion rule that converts alignment measurement results from the in-line preliminary measurement and inspection apparatus 14a into a format that can be used by the exposure apparatus 13. As is shown in FIG. 4, in the file format conversion definition file F1, a correspondence between information handled by the in-line preliminary measurement and inspection apparatus 14a which is the transmission source and information handled by the exposure apparatus 13 which is the transmission recipient is created for each line. Each line is made up of fields f11 to f13 that are partitioned by a colon ":", and a field f14 that is partitioned by a semicolon ";".

Tag names that are attached to information handled by the in-line preliminary measurement and inspection apparatus 14a that is the transmission source are described in the field f11. Tag names that are attached to information handled by the exposure apparatus 13 that is the transmission recipient are described in the field f12. A correspondence is created between the information handled by the in-line preliminary measurement and inspection apparatus 14a which is the transmission source and the information handled by the exposure apparatus 13 which is the transmission recipient using the description contents of these fields f11 and f12. A conversion formula for the information is described in the field f13.

If it is not necessary for the information to be converted, the field f13 is omitted. Comments on the contents described in a particular line are described in the field f14.

For example, "L1" is described as a tag name in the first line of the field f11 shown in FIG. 4. "MEAS_DATE" is described as a tag name in the field f12, and the field f13 is omitted. In the field f14, "measurement date" is described as a comment. Namely, in this first line, the tag "L1" is attached to information showing the measurement date that is handled by the in-line preliminary measurement and inspection apparatus 14a that is the transmission source. The tag "MEAS_DATE" is attached to information showing the measurement date that is handled by the exposure apparatus 13 that is the transmission recipient. When information showing the measurement date is transmitted from the in-line preliminary measurement and inspection apparatus 14a to the exposure apparatus 13, contents are described for a transmission in which there is no alteration of values and only the tag name is converted.

Moreover, "W4" is described as a tag name in the seventh line of the field f11 shown in FIG. 4. "MAP_OFFSET (1)" is described as a tag name in the field f12, and the conversion formula "W4+1" is described in the field f13. In the field f14, "map offset X" is described as a comment. Namely, in this seventh line, the tag "W4" is attached to information showing the map offset X that is handled by the in-line preliminary measurement and inspection apparatus 14a that is the transmission source. The tag "MAP_OFFSET (1)" is attached to information showing the map offset X that is handled by the exposure apparatus 13 that is the transmission recipient. When information showing the map offset X is transmitted from the in-line preliminary measurement and inspection apparatus 14a to the exposure apparatus 13, contents are described for a transmission in which the value is incremented (i.e., "1" is added to the value of the information attached to the tag W4) and the tag name is converted.

Note that the conversion formula in the field f13 does not need to be a simple one such as incrementing the value of the transmission information, and it is also possible to describe a formula that uses a mathematical function. For example, if alignment marks that are formed on a wafer W are measured using the alignment sensor 41 (see FIG. 2), waveform image data is obtained in which the signal strength changes in accordance with the position in the X direction or the position in the Y direction, however, it is possible to use a function that alters offset in the waveform image data in accordance with the position in the X direction or the position in the Y direction. A trigonometric function or a multidimensional polynomial function relating to X or Y or the like can be used as this function. It is also possible to use a computational formula that determines the value of one information item from among the values of a plurality of information items.

Figure 5:
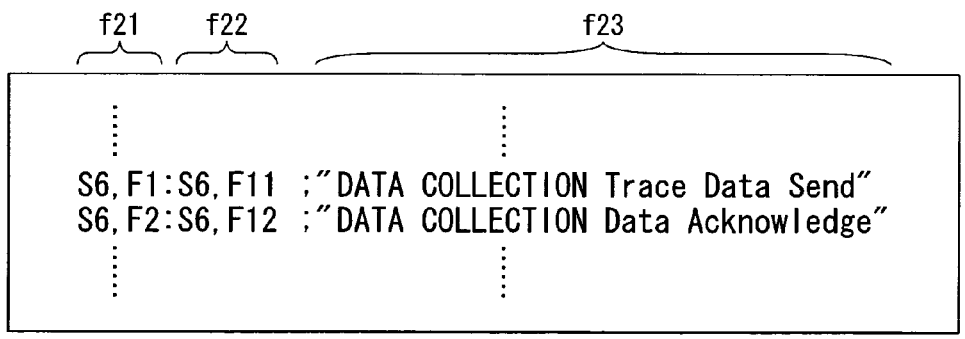
FIG. 5 is a view showing an example of contents of a communication message conversion definition file.

FIG. 5 is a view showing an example of contents of the communication message conversion definition file F2. The communication message conversion definition file F2 shown in FIG. 5 is a portion of a conversion rule that converts communication messages used by the in-line preliminary measurement and inspection apparatus 14a into communication messages that are used by the exposure apparatus 13. As is shown in FIG. 5, in the communication message conversion definition file F2, a correspondence between communication messages used by the in-line preliminary measurement and inspection apparatus 14a which is the transmission source and communication messages used by the exposure apparatus 13 which is the transmission recipient is created for each line.

Each line is made up of fields f21 and f22 that are partitioned by a colon ":", and a field f23 that is partitioned by a semicolon ";".

Communication messages that are used by the in-line preliminary measurement and inspection apparatus 14a which is the transmission source are described in the field f21, while communication messages used by the exposure apparatus 13 which is the transmission recipient are described in the field f22. Comments on the contents described in a particular line are described in the field f23. Note that, as is shown in FIG. 5, a correspondence is created between the communication messages that are used by the in-line preliminary measurement and inspection apparatus 14a which is the transmission source and communication messages that are used by the exposure apparatus 13 which is the transmission recipient in each line of the communication message conversion definition file F2, however, it is not absolutely essential for all correspondences between communication messages used by the in-line preliminary measurement and inspection apparatus 14a and the exposure apparatus 13 to be described, and only those communication messages that require conversion need to be described.

A communication message "S6, F1" is described in the first line of the field f21 shown in FIG. 5, while a communication message "S6, F11" is described in the field f22. The comment "Data Collection Trace Data Send" is described in the field f23. Namely, in this first line, for a communication message made up of "Trace Data Send" that is used to collect data, a stream number "6" and a function number "1" are used in the in-line preliminary measurement and inspection apparatus 14a, while contents are described in the exposure apparatus 13 to convert this to a stream number "6" and a function number "11".

Figure 6:
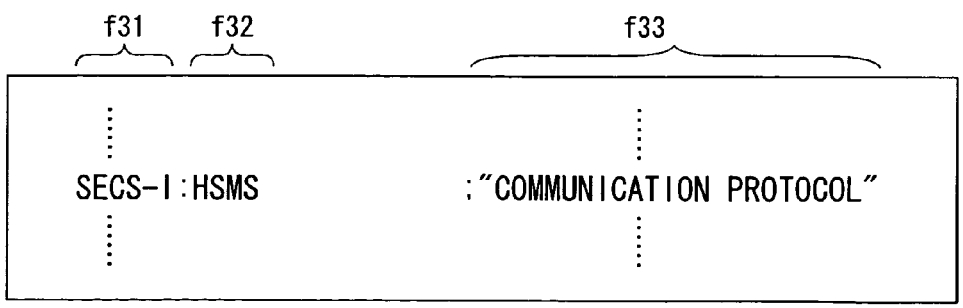
FIG. 6 is a view showing an example of contents of a communication protocol conversion definition file.

FIG. 6 is a view showing an example of contents of a communication protocol conversion definition file F3. The communication protocol conversion definition file F3 shown in FIG. 6 is a portion of a conversion rule that converts communication protocols used by the in-line preliminary measurement and inspection apparatus 14a into communication protocols that are used by the exposure apparatus 13. As is shown in FIG. 6, in the communication protocol conversion definition file F3, a correspondence between communication protocols used by the in-line preliminary measurement and inspection apparatus 14a which is the transmission source and communication protocols used by the exposure apparatus 13 which is the transmission recipient is created for each line. Each line is made up of fields f31 and f32 that are partitioned by a colon ":", and a field f33 that is partitioned by a semicolon ";".

Communication protocols that are used by the in-line preliminary measurement and inspection apparatus 14a which is the transmission source are described in the field f31, while communication protocols used by the exposure apparatus 13 which is the transmission recipient are described in the field f32. Comments on the contents described in a particular line are described in the field f33. A communication protocol "SECS-I" is described in the first line of the field f31 shown in FIG. 6, while a communication protocol "HSMS" is described in the field f32. The comment "Communication protocol" is described in the field f33. Namely, in this first line contents are described to use the communication protocol "SECS-I" when communication is performed with the in-line preliminary measurement and inspection apparatus 14a, and to use the communication protocol "HSMS" when performing communication with the exposure apparatus 13.

Conversion recipes, in which is described information stipulating which conversion definition file is to be used from among the plurality of conversion definition files registered in the conversion definition file registration section 54, are registered in file format in the conversion recipe registration section 55. These conversion recipes are registered for each combination of any two device manufacturing processing apparatuses from among the plurality of device manufacturing processing apparatuses that are connected to the communication server 20. For example, in the example shown in FIG. 3, three conversion recipe files R1 to R3 are registered in the conversion recipe file section 55. The conversion recipe file R1 is set in order to connect the exposure apparatus 13 and the in-line preliminary measurement and inspection apparatus 14a. The conversion recipe file R2 is set in order to connect the exposure apparatus 13 and the in-line post-measurement and inspection apparatus 14b. The conversion recipe file R3 is set between the exposure apparatus 13 and the off-line measurement and inspection apparatus 16. These conversion recipe files are text format files and a user is able to freely alter the contents thereof.

Figures 7, 8:
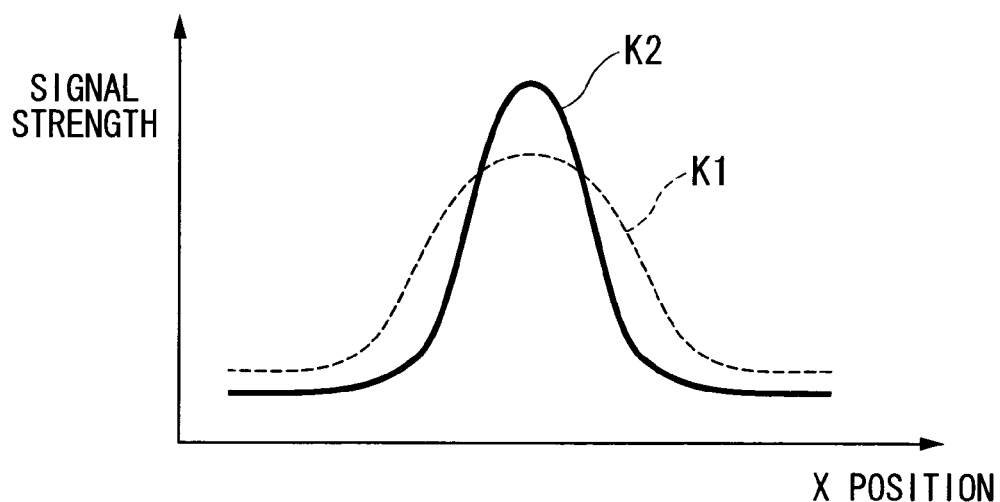
FIG. 7 is a view showing an example of contents of a conversion recipe file.
FIG. 8 is a view showing an example of a difference between measurement results from an alignment sensor that is provided with an in-line preliminary measurement and inspection apparatus and measurement results from an alignment sensor that is provided with an exposure apparatus.

FIG. 7 is a view showing an example of contents of a conversion recipe file. As is shown in FIG. 7, a conversion recipe file number that is uniquely determined between conversion recipe files is described in the first line in the conversion recipe file RI, while connected apparatus names are described in the second line thereof. In the .example shown in FIG. 7, the exposure apparatus 13 and the in-line preliminary measurement and inspection apparatus 14a are described as connected device names. In the third line a format file conversion definition file name is described, while in the fourth line a communication message conversion definition file name is described, and in the fifth line a communication protocol conversion definition file name is described.

A file name of the file format conversion definition file F1 (for example, A1.txt) is described as the format file conversion definition file name. A file name of the communication message conversion definition file F2 (for example, A2.txt) is described as the communication message conversion definition file name. Furthermore, a file name of the communication protocol conversion definition file F3 (for example, C1.txt) is described as the communication protocol conversion definition file name.

Namely, one of each of the file format conversion definition file F1, the communication message conversion definition file F2, and the communication protocol conversion definition file F3 that are registered in the conversion definition file registration section 54 is specified by these conversion recipe files for each combination of any two device manufacturing processing apparatuses from among the plurality of device manufacturing processing apparatuses that are connected to the communication server 20.

Note that it is also possible for a plurality of each of the format file conversion definition file names, the communication message conversion definition file names, and the communication protocol conversion definition file names to be described in the conversion recipe files. When a plurality of the format file conversion definition file names, the communication message conversion definition file names, or the communication protocol conversion definition file names are described in the conversion recipe files, then conversion processing is performed by the conversion section 53 in accordance with conversion rules that are obtained by synthesizing the conversion rules defined by each of the plurality of described conversion definition files.

It will now be assumed that a communication protocol conversion definition file whose file name is "C11.txt" and a communication protocol conversion definition file whose file name is "C12.txt" are present. Conversion rules for a communication protocol between the exposure apparatus 13 and the in-line preliminary measurement and inspection apparatus 14a are defined in the communication protocol conversion definition file whose file name is "C11.txt", while conversion rules for a communication protocol between the exposure apparatus 13 and the in-line post-measurement and inspection apparatus 14b are defined in the communication protocol conversion definition file whose file name is "C12.txt".

When both these "C11.txt" and "C12.txt" are described as the communication protocol conversion definition file name in the conversion recipe file that is used to connect the in-line preliminary measurement and inspection apparatus 14a and the in-line post-measurement and inspection apparatus 14b, the communication protocol conversion section 53c of the conversion section 53 synthesizes these conversion rules and, without using the communication protocol of the exposure apparatus 13, performs conversion processing of the communication protocol used by the in-line preliminary measurement and inspection apparatus 14a and the communication protocol used by the in-line post-measurement and inspection apparatus 14b. By making the above described description method possible, it is possible to lessen the trouble and labor required by a user to create a conversion recipe file and a conversion definition file.

When using the communication server 20 that has the above described structure, a user firstly connects the device manufacturing processing apparatuses (i.e., the exposure apparatus 13, the in-line measurement and inspection apparatus 14, the truck 15, the off-line measurement and inspection apparatus 16, the analysis system 17, and the substrate processing apparatus 18) to the communication server 20 using a connection cable. At this time, the device manufacturing processing apparatuses are connected to the communication server 20 using connection cables suitable for the connection interface provided in the device manufacturing processing apparatuses. Specifically, when connecting the exposure apparatus 13, for example, an Ethernet (registered trademark) cable that is provided with an RJ-45 connector is used for the connection, while when connecting the in-line measurement and inspection apparatus 14, an RS-232C cable is used for the connection.

Next, a user creates a file format conversion definition file F1, a communication message conversion definition file F2, and a communication protocol conversion definition file F3 to match the device manufacturing processing apparatus that is connected to the communication server 20 and registers them in the conversion definition file registration section 54. In conjunction with this, the user creates a conversion recipe file for each combination of device manufacturing processing apparatuses connected to the communication server 20 and registers it in the conversion recipe registration section 55.

In order to create all of the file format conversion definition file F1, the communication message conversion definition file F2, and the communication protocol conversion definition file F3, a user requires knowledge of communication technology, and the creation task itself is extremely time-consuming. Because of this, it is desirable for it to be possible to download the conversion definition files from a server system, for example, via the Internet. By making it possible to download the conversion definition files, it becomes possible for a user to edit only the required minimum number of conversion definition files.

After the above described tasks have been performed, the power of the communication server 20 is turned on and the conversion recipe files registered in the conversion recipe registration section 55 are sequentially read in the conversion section 53. When the conversion recipe files have been read in the conversion section 53, conversion recipe files having file names that are described in the conversion recipe files are read from the conversion definition file registration section 54, and conversion rules defined by the conversion definition files are sequentially applied in the conversion section 53. Note that because the conversion rules are different for each combination of device manufacturing processing apparatuses, a plurality of conversion rules are applied in the conversion section 53. Once the above described processing has ended, communication via the communication server 20 becomes possible between the device manufacturing processing apparatuses that are connected to the communication server 20. Note that an example of when a new connection is made to the communication server 20 is described above, however, it is also possible to increase the number of device manufacturing processing apparatuses that are already connected to the communication server 20.

Next, a specific operation when waveform image data is transmitted from the in-line preliminary measurement and inspection apparatus 14a to the exposure apparatus 13 that are shown in FIGS. 1 and 3 will be described. This waveform image data is taken as the alignment measurement results from the in-line preliminary measurement and inspection apparatus 14a, and shows that the signal strength changes in accordance with the position in the X direction (i.e., the X position). When the in-line preliminary measurement and inspection apparatus 14a transmits waveform image data to the exposure apparatus 13, it uses the communication protocol "SECS-I" between itself and the communication server 20, and transmits waveform image data by communicating using communication messages stored in advance in the in-line preliminary measurement and inspection apparatus 14a. The waveform image data transmitted from the in-line preliminary measurement and inspection apparatus 14a is received by the transmitting and receiving section 52 of the communication server 20.

The waveform image data received by the transmitting and receiving section 52 is output to the conversion section 53. When the waveform image data is input into the conversion section 53, the file format conversion section 53a converts the input waveform image data in accordance with the contents of the file format conversion definition file F1 specified by the conversion recipe file that regulates connections between the in-line preliminary measurement and inspection apparatus 14a and the exposure apparatus 13. The conversion rules regulated by this file format conversion definition file F1 are applied in advance in the file format conversion section 53a when the power is turned on to the communication server 20 or when a reset is executed.

Here, it will be assumed that it is known in advance that there is a difference between the measurement results from the alignment sensor provided in the in-line preliminary measurement and inspection apparatus 14a and the measurement results from the alignment sensor 41 (see FIG. 2) provided in the exposure apparatus 13. FIG. 8 is a graph showing an example of a difference between the measurement results from the alignment sensor provided in the in-line preliminary measurement and inspection apparatus 14a and the measurement results from the alignment sensor 41 provided in the exposure apparatus 13. In FIG. 8, the waveform image data to which the symbol K1 is attached is obtained as a result of the alignment sensor provided in the in-line preliminary measurement and inspection apparatus 14a measuring particular alignment marks, while the waveform image data to which the symbol K2 is attached is obtained as a result of the alignment sensor 41 provided in the exposure apparatus 13 measuring the same alignment marks.

When there is a difference in measurement results such as that shown in FIG. 8, it is difficult to use the waveform image data obtained from the in-line preliminary measurement and inspection apparatus 14a in the exposure apparatus 13 without any modification being made thereto. Because of this, if a conversion rule for absorbing differences in measurement results that are known in advance is defined by the file format conversion definition file F1, and waveform image data from the in-line preliminary measurement and inspection apparatus 14a is converted by the file format conversion section 53a using this conversion rule, then this converted waveform image data can be used by the exposure apparatus 13.

If conversion processing is performed to add, for example a different offset for each X position to the waveform image data shown in FIG. 8, then it is possible to convert the waveform image data K1 into the waveform image data K2. Accordingly, if a conversion rule to add these offsets is defined in advance in the file format conversion definition file F1, and this file format conversion definition file F1 is specified by the conversion recipe file regulating connections between the in-line preliminary measurement and inspection apparatus 14a and the exposure apparatus 13, then the above described difference in the measurement results can be absorbed and the waveform image data can be converted into waveform image data suitable for processing by the exposure apparatus 13. Note that, here, an example is given of waveform image data in which the signal strength changes in accordance with the X position, however, waveform image data in which the signal strength changes in accordance with the Y position and waveform image data in which the signal strength changes with the temporal position can also be converted using the same method. Moreover, the waveform image data can be converted using the same method irrespective of whether the data is one-dimensional data, two-dimensional data, or three-dimensional data.

In accordance with the contents of the communication message conversion definition file F2 that is specified by the conversion recipe file regulating connections between the in-line preliminary measurement and inspection apparatus 14a and the exposure apparatus 13, the communication message conversion section 53b of the conversion section 53 converts waveform image data corresponding to the communication message used in communication between itself and the in-line preliminary measurement and inspection apparatus 14a into waveform image data corresponding to a communication message that can be recognized by the exposure apparatus 13. Furthermore, in accordance with the contents of the communication protocol conversion definition file F3 that is specified by the conversion recipe file regulating connections between the in-line preliminary measurement and inspection apparatus 14a and the exposure apparatus 13, the communication protocol conversion section 53c of the conversion section 53 converts information received via the communication protocol used in communication between itself and the in-line preliminary measurement and inspection apparatus 14a (i.e., SECS-I) into information transmitted via a communication protocol that is suitable for communication between itself and the exposure apparatus 13 (i.e., HSMS). Note that the above described conversion rules regulated by the communication message conversion definition file F2 and conversion rules regulated by the communication protocol conversion definition file F3 are also applied in advance respectively in the communication message conversion section 53b and the communication protocol conversion section 53c when the power is turned on for the communication server 20 or when a reset is executed.

The waveform image data that has undergone the above described conversion processing is output from the conversion section 53 to the transmitting and receiving section 51, and is then transmitted from the transmitting and receiving section 51 to the exposure apparatus 13. As a result of the above processing, the communication server 20 receives waveform image data from the in-line preliminary measurement and inspection apparatus 14a that is the transmission source in a mode that is compatible with the in-line preliminary measurement and inspection apparatus 14a, and then transmits the received information in a mode that is compatible with the exposure apparatus 13 that is the transmission destination. Note that if a plurality of conversion definition files are described in a conversion recipe file, then other than processing to synthesize the conversion rules, the same processings as the processings described above are performed and data is exchanged between two device manufacturing processing apparatuses. As is described above, in the present embodiment, it is possible, without having to improve the device manufacturing processing apparatuses that are connected to the communication server 20, to connect together device manufacturing processing apparatuses via the communication server 20.

Figure 9:
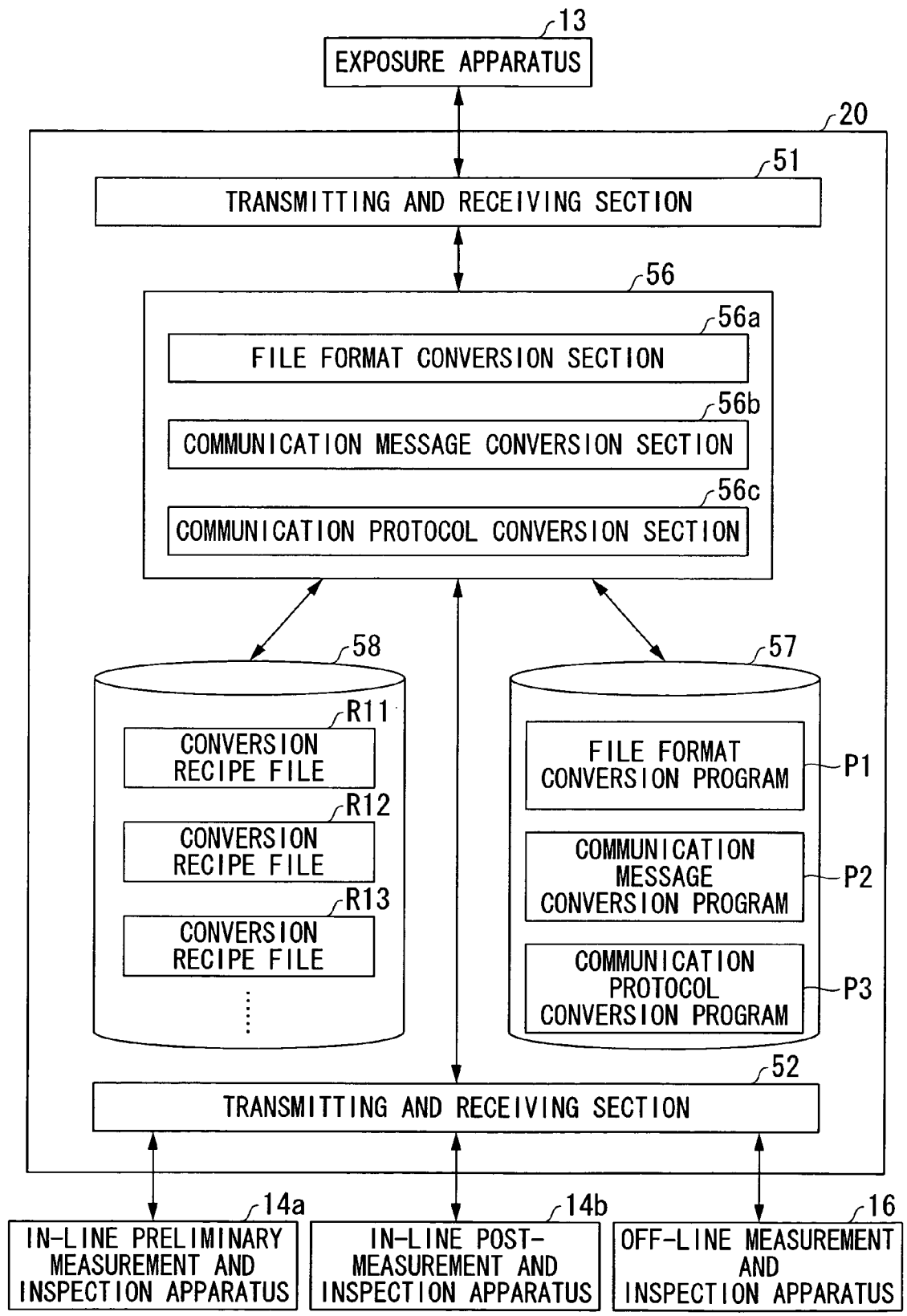
FIG. 9 is a block diagram showing a variant example of a communication server.

Next, a variant example of a communication server will be described. FIG. 9 is a block diagram showing a variant example of a communication server. Note that, in FIG. 9, structure that is the same as that in FIG. 3 is given the same descriptive symbols. A communication server 21 shown in FIG. 9 differs in that, instead of the conversion section 53, the conversion definition file registration section 54, and the conversion recipe registration section 55 provided in the communication server 20 shown in FIG. 3, it is provided with a conversion section 56, a conversion program registration section 57, and a conversion recipe registration section 58.

The conversion section 56 is provided with a file format conversion section 56a, a communication message conversion section 56b, and a communication protocol conversion section 56c that perform the same conversion processing as the file format conversion section 53a, the communication message conversion section 53b, and the communication protocol conversion section 53c that are provided in the conversion section 53 shown in FIG. 3. The file format conversion section 53a, the communication message conversion section 53b, and the communication protocol conversion section 53c shown in FIG. 3 perform conversion processing based on the contents of a conversion definition file specified by a conversion recipe, however, the file format conversion section 56a, the communication message conversion section 56b, and the communication protocol conversion section 56c that are provided in the conversion section 56 differ in that, by accessing and executing a conversion program specified by a conversion recipe, they can perform conversion processing corresponding to that conversion program.

A plurality of file format conversion programs P1, communication message conversion programs P2, and communication protocol conversion programs P3 that are accessed respectively from the file format conversion section 56a, the communication message conversion section 56b, and the communication protocol conversion section 56c that are provided in the conversion section 56 are registered in file format in the conversion program registration section 57. In each of the various conversion definition files shown in FIG. 3, the conversion rules are described in text format, however, each of the various conversion programs shown in FIG. 9 are accessed from the conversion section 56 and actually perform the conversion processing.

It is desirable for the file format conversion programs P1, communication message conversion programs P2, and communication protocol conversion programs P3 to be created, for example, in dynamic link library (DLL) format. These conversion programs are also registered in the conversion program registration section 57 using uniquely determined file names. Note that, being programs, basically, it is not possible for the contents thereof to be altered by a user, however, because of this operational errors can be correspondingly reduced.

Conversion recipes in which is described information specifying which of the plurality of conversion programs registered in the conversion program registration section 57 is to be used are registered in file format in the conversion recipe registration section 58. The conversion recipe files R11 to R13, . . . , are registered for each combination of two device manufacturing processing apparatuses from among the plurality of device manufacturing processing apparatuses connected to the communication server 21. These conversion recipe files R11 to R13, . . . , are text format files and a user is able to freely alter the contents thereof.

Figures 10, 11:
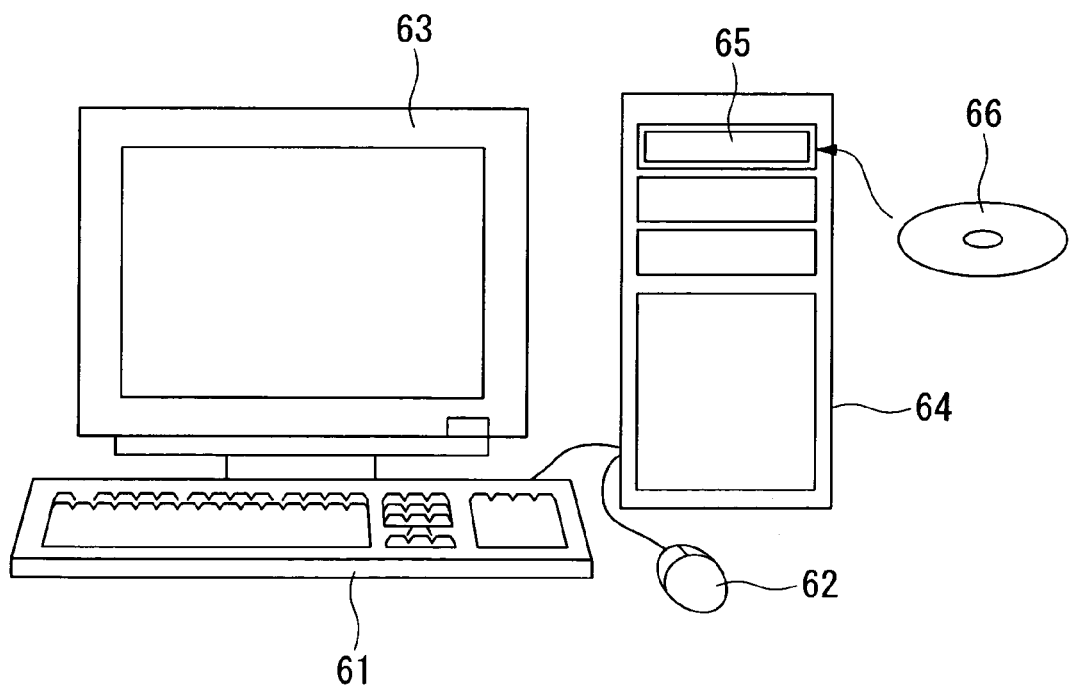
FIG. 10 is a view showing an example of contents of a conversion recipe file that is used in a communication server.
FIG. 11 is a front view showing an exterior of a communication server that is realized by a computer.

FIG. 10 is a view showing an example of contents of a conversion recipe file used by the communication server 21. As is shown in FIG. 10, the conversion recipe files R11 to R13, . . . , used by the communication server 21 have substantially the same contents as the conversion recipe files R1 to R3, . . . , used by the communication server 20. Namely, a conversion recipe file number that is uniquely determined between conversion recipe files is described in the first line, while connected apparatus names are described in the second line. In the example shown in FIG. 10, the exposure apparatus 13 and the in-line preliminary measurement and inspection apparatus 14a are described as connected device names. However, these conversion recipe files R11 to R13, . . . , differ in that a format file conversion program name, a communication message conversion program name, and a communication protocol conversion program name are described respectively in the third through fifth lines. Note that it is also possible in the conversion recipe files R11 to R13, . . . , that are used in the communication server 21 for a plurality of the format file conversion program names, the communication message conversion program names, and the communication protocol conversion program names to be described.

Substantially the same type of conversion processing as that performed in the communication server 20 shown in FIG. 3 is also performed in the communication server 21 having the above described structure. Because of this, it is also possible when using the communication server 21 as well to mutually connect device manufacturing processing apparatuses via the communication server 21 without having to improve the device manufacturing processing apparatuses that are connected to the communication server 21. Moreover, in the present embodiment, although it is not impossible for a user to create a conversion program, it does require an extremely large amount of labor. Because of this, it is desirable for it to be possible to download a conversion program from a server system, for example, via the Internet. By making it possible to download a conversion program, a user only needs to create and edit a conversion recipe file.

The communication servers 20 and 21 described above are also able to be realized using a computer. FIG. 11 is a front view showing an exterior of the communication servers 20 and 21 that are realized using a computer. As is shown in FIG. 11, the computer by means of which the communication servers 20 and 21 are realized includes input devices such as a keyboard 61 and a mouse 62, a display unit 63 such as a cathode ray tube (CRT) or a liquid crystal display unit, and a main body unit 64.

A central processing unit (CPU), internal storage devices such as random access memory (RAM) and read only memory (ROM), and an external storage device such as a hard disk (all omitted from the drawings) are provided inside the main body unit 64. In addition, a drive device 65 such as a CD-ROM drive or a DVD (registered trademark)-ROM drive are also provided in the main body unit 64. Furthermore, a plurality of connection interfaces (for example, connection interfaces to which an RJ-45 connector or an RS-232C connector may be connected) that are used for connecting device manufacturing processing apparatuses such as the exposure apparatus 13, the in-line preliminary measurement and inspection apparatus 14a, and the in-line post-measurement and inspection apparatus 14b are provided on a rear surface of the main body unit 64.

Furthermore, a program that realizes the functions of the conversion section 53 (i.e., the file format conversion section 53a, the communication message conversion section 53b, and the communication protocol conversion section 53c) shown in FIG. 2, or a program that realizes the functions of the conversion section 56 (i.e., the file format conversion section 56a, the communication message conversion section 56b, and the communication protocol conversion section 56c) shown in FIG. 9 is installed in the main body unit 64. This program is stored on a recording medium 66 capable of being read by a computer such as, for example, a CD-ROM or a DVD (registered trademark)-ROM, and the program that is recorded on this recording medium 66 is read using the drive device 65 and is installed in the main body unit 64.

Note that it is also possible to connect a server system that is capable of transmitting the above described programs to a network that is set up in a device manufacturing plant, and connect the communication servers 20 and 21 to the same network so that online installation becomes possible. Alternatively, it is also possible to connect the communication servers 20 and 21 to the Internet and to then download and install the above programs via the Internet.

The conversion definition file registration section 54 in which the file format conversion definition file F1, the communication message conversion definition file F2, and the communication protocol conversion definition file F3 are registered, as well as the conversion recipe registration section 58 in which the conversion recipe files are registered that are shown in FIG. 3, or the conversion program registration section 57 in which the file format conversion program PI, the communication message conversion program P2, and the communication protocol conversion program P3 are registered, as well as the conversion recipe registration section 58 in which the conversion recipe files are registered that are shown in FIG. 9 may be realized using an external storage device such as a hard disk or an internal storage device that is provided, for example, inside the aforementioned main body unit 64. In particular, in most operating systems (OS), when recording information on a hard disk the information is recorded in file format. Accordingly, this is extremely favorable for registering the above described various conversion definition files and conversion recipe files.

In the above description, an example is described in which a single communication server 20 or 21 is connected to a plurality of device manufacturing processing apparatuses (i.e., the exposure apparatus 13, the in-line measurement and inspection apparatus 14, the truck 15, the off-line measurement and inspection apparatus 16, the analysis system 17, and the substrate processing apparatus 18). However, a large variety of device manufacturing processing apparatuses are provided inside a device manufacturing plant, and it may be considered uncommon for just one communication server to be provided inside a device manufacturing plant.

In addition, it is possible for a communication server to be connected to a large variety of device manufacturing processing apparatuses, however, it can also be considered that a communication server may also be commonly used for a connection between specific device manufacturing processing apparatuses (for example, the exposure apparatus 13 and the in-line measurement and inspection apparatus 14). Because of this, it is clearly possible for a number of communication servers having similar connection modes to be placed inside a device manufacturing plant. For a user to create the file format conversion definition file F1, the communication message conversion definition file F2, and the communication protocol conversion definition file F3, as well as the conversion recipe files R1 to R3 that are each shown in FIG. 3 for all of the communication servers in the device manufacturing plant, or to create the conversion recipe files R11 to R13, . . . , shown in FIG. 9 is a huge task and requires considerable man-hours.

Because of this, it is desirable, for example, to connect each of the communication servers provided inside a device manufacturing plant to a network that is set up inside the device manufacturing plant, and thereby make it possible to acquire the file format conversion definition file F1, the communication message conversion definition file F2, and the communication protocol conversion definition file F3, as well as the conversion recipe files R1 to R3, . . . , that are each shown in FIG. 3 and are registered in a communication server, or to acquire the conversion recipe files R11 to R13, . . . , as well as the file format conversion program P1, the communication message conversion program P2, and the communication protocol conversion program P3 that are shown in FIG. 9 from another communication server. Consequently, if the above described various files are created using a single communication server inside a device manufacturing plant, and if these files are acquired from another communication server inside the device manufacturing plant, then it becomes possible to connect device manufacturing processing apparatuses using a large number of communication servers and the workload on a user can be reduced.

[Device Manufacturing Method]

Figure 12:
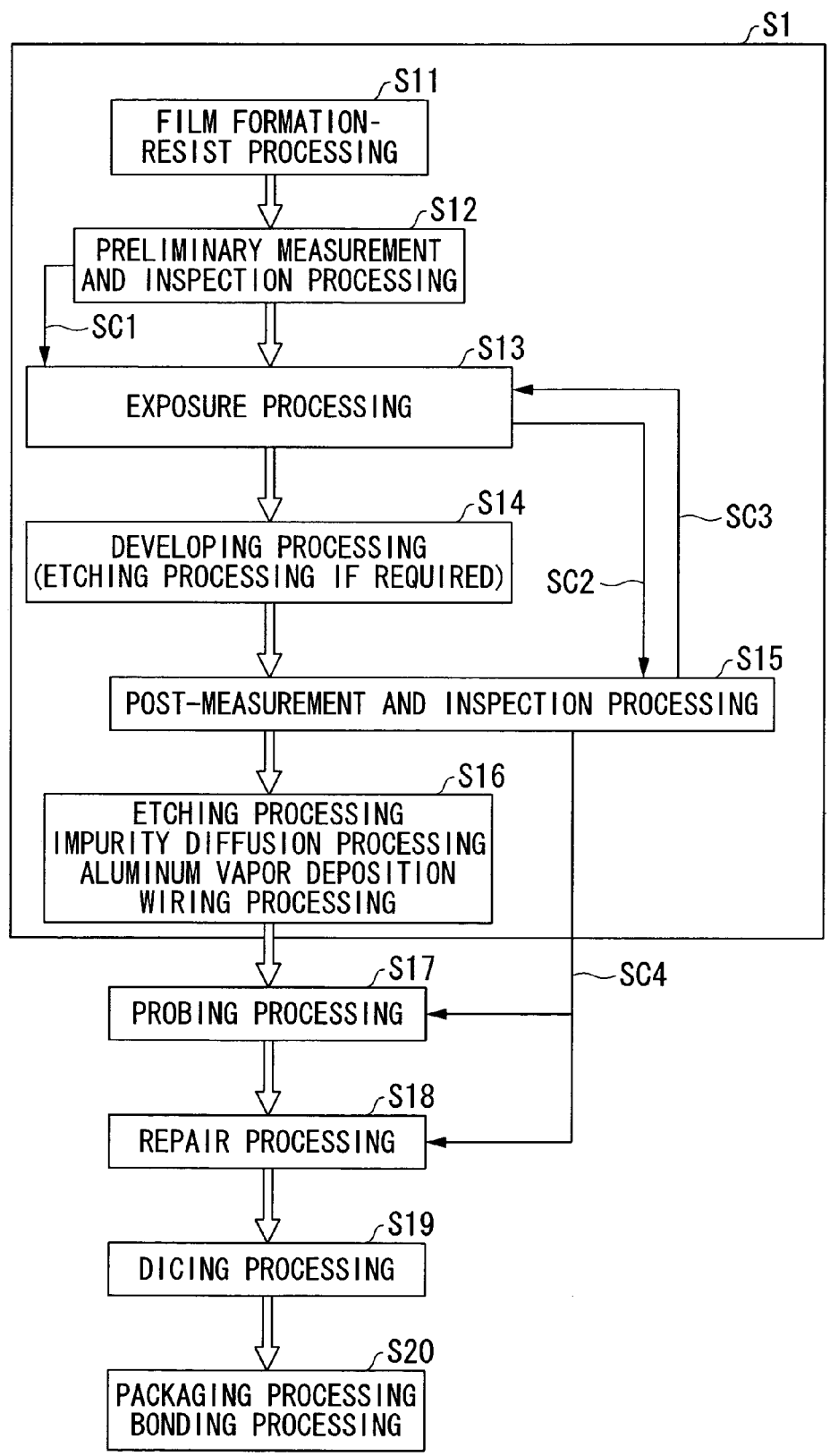
FIG. 12 is a flowchart that is used to illustrate a device manufacturing method that uses a device manufacturing processing system according to an embodiment.

FIG. 12 is a flowchart illustrating a device manufacturing processing system according to an embodiment of the present invention. The device manufacturing method shown in FIG. 12 can be applied when manufacturing any of a semiconductor chip such as an IC or LSI, a liquid crystal panel, a CCD, a thin film magnetic head, a micro machine or the like, however, here, the manufacturing of a semiconductor chip is described as an example. In FIG. 12, the outlined arrows indicate the transition of processing performed on a wafer W, and the solid arrows indicate the flow of information during each processing. It will be assumed that the device manufacturing processing described below is performed in lot units taking a plurality of (for example, 25) wafers W as a unit. In addition, in the description below, an example is described in which a device is manufactured using a device manufacturing processing system that is provided with the communication server 20 shown in FIG. 1.

When processing is commenced, firstly, one lot of wafers W is transported to the CVD apparatus 18a shown in FIG. 1 and film formation processing is performed in order to form a semiconductor thin film on the wafer W. In this processing, the same semiconductor film is formed on all the semiconductor wafers W of the one lot (step S11). When film formation processing is ended, the wafers W making up the lot are transported to the coater/developer 15a provided inside the truck 15. Photoresist is then sequentially coated on the wafers W by the coater/developer 15a. The wafers W on which the photoresist has been coated are transported by the in-line preliminary measurement and inspection apparatus 14a and preliminary measurement and inspection processing is performed (step S12).

In this preliminary measurement and inspection processing, measurement of alignment marks formed on the wafer W, measurement of height differences on the surface of the wafer W, and inspection of defects and foreign matter on the wafer W are performed. In addition, from these measurement and inspection results, optimization of the parameters for the alignment processing (i.e. positioning processing) that is performed during an exposure by the exposure apparatus 13 and also optimization of the parameters that are used for the auto-focus control that is performed during an exposure by the exposure apparatus 13 are performed.

Namely, as is described above, in the exposure apparatus 13, EGA measurements are made in order to determine the layout of all the shot areas set on the wafer W from the results of measuring a representative number of alignment marks that are formed on the wafer W. Here, when the EGA measurements are made using the exposure apparatus 13, if there is any deformation in the alignment marks to be measured or if any foreign matter is adhering thereto, then it is not possible to accurately determine the layout of the shot areas, which results in errors occurring in the positioning during exposure. In order to prevent this, a measurement of the alignment marks and an inspection of defects or foreign matter on the wafer W are made in advance by the in-line preliminary measurement and inspection apparatus 14a, the alignment marks to be used in the EGA measurement are then selected, and the parameters for alignment processing such as determining measurement algorithms to be used when the alignment marks are measured by the alignment sensor 41 are then optimized.

Moreover, when the exposure apparatus 13 is the step-and-scan mode reduced size projection type of exposure apparatus shown in FIG. 2, exposure processing is performed while the wafer W is being moved. During an exposure, auto-focus control is performed in order to match the surface of the wafer W to the image surface of the projection optical system PL based on detection results from the AF sensor 40, however, the optimum control method differs in accordance with the surface condition of the wafer W. Because of this, any differences in level on the surface of the wafer W are measured in advance by the in-line preliminary measurement and inspection apparatus 14a, and the parameters used for focusing control are optimized.

When preliminary measurement and inspection processing is performed by the in-line preliminary measurement and inspection apparatus 14a, the formation positions of the alignment marks on the wafer W and the various parameters used in the EGA measurements of the exposure apparatus 13 and the like are transmitted from the exposure apparatus 13 to the in-line preliminary measurement and inspection apparatus 14a via the communication server 20. In addition, the aforementioned various parameters and various measurement results that were obtained by the preliminary measurement and inspection processing of the in-line preliminary measurement and inspection apparatus 14a are also transmitted from the in-line preliminary measurement and inspection apparatus 14a to the exposure apparatus 13 via the communication server 20 (step SC1). As a result, the various parameters required to optimize the exposure conditions of the exposure apparatus 13 are fed forward to the exposure apparatus 13.

When the above described processing has ended, the exposure processing of the wafer W is performed by the exposure apparatus 13 (step S13). When the exposure processing commences, a reticle R that corresponds to the exposure recipe is held on the reticle stage RST, and a wafer W that has undergone preliminary measurement and inspection processing from the in-line preliminary measurement and inspection apparatus 14a is transported to the exposure apparatus 13 and is held on the wafer stage WST. Next, the main control unit MC of the exposure apparatus 13 moves the wafer stage WST within an XY plane, and alignment marks that have been designated in the parameters transmitted from the in-line preliminary measurement and inspection apparatus 14a are placed within the measurable field of view of the alignment sensor 41. These alignment marks are then measured. When the measuring of the alignment marks designated by the parameters has ended, the main control unit MC performs an EGA calculation and determines the layout of all the shot areas on the wafer W.

When the EGA measurement has ended, exposure of the respective shot areas set on the wafer W is performed. When exposing a shot area, the main control unit MC drives the wafer drive apparatus 39 causing the wafer stage WST to be moved within the XY plane such that the shot area that is to be exposed first is placed at a movement start position. At the same time as this, the reticle drive apparatus 34 is driven by the main control unit MC and the reticle stage RST is also placed at the movement start position. When this placement is completed, the main control unit MC starts the movements of the reticle stage RST and the wafer stage WST. Once the reticle stage RST and wafer stage WST have reached a predetermined speed and a stabilization time (i.e., a time that is provided in order to subdue any vibration generated by the acceleration of the reticle stage RST and wafer stage WST) has elapsed, the main control unit MC outputs a control signal to the illumination optical system ILS and thereby causes exposure light EL to be emitted. As a result, the exposure light EL is irradiated onto the reticle R and the exposure of the shot area commences.

During the exposure of the shot area, the main control unit MC causes the reticle stage RST and the wafer stage WST to move in the Y direction at a constant speed. In addition, during the exposure of the shot area, the main control unit MC performs auto-focus control in accordance with the parameters transmitted from the in-line preliminary measurement and inspection apparatus 14a and with the detection results from the AF sensor 40, and matches the surface of the wafer W with the image surface of the projection optical system PL. When the exposure of one shot area has ended, the main control unit MC causes the wafer stage WST to move within the XY plane and places the shot area to be exposed next at the movement start position. Thereafter, in the same manner, exposure is performed on all of the shot areas on the wafer W.

When exposure of all of the shot areas on the wafer W has been completed, the wafer W being held on the wafer stage WST is removed and a new wafer W that has completed the preliminary measurement and inspection processing of the in-line preliminary measurement and inspection apparatus 14a is transported to the exposure apparatus 13 and held on the wafer stage WST. When the exposure of each shot area, or the exposure processing of each wafer W, or the exposure processing of each lot has ended, the main control unit MC temporarily records execution parameters used when performing the exposure processing, the various measurement results such as the alignment measurement results, and various trace data showing exposure results. Here, included in the trace data is, for example, synchronization accuracy trace data that shows the accuracy of the synchronization of the wafer stage WST and the reticle stage RST during an exposure, and focusing trace data that, for each position of a wafer W, shows control discrepancies in the position and attitude of the surface of the wafer W relative to the image surface of the projection optical system PL during an exposure.

The wafer W that has completed exposure processing and been removed from the exposure apparatus 13 is transported to the coater/developer 15a provided in the truck 15 and developing processing is performed (step S14). The wafer W that has undergone developing processing is transported to the in-line post-measurement and inspection apparatus 14b and post-measurement and inspection processing is performed (step S15). In this post-measurement and inspection processing, overlay measurement and line width measurement and the like are performed. Note that, if necessary, this post-measurement processing may also be performed after the etching processing described below.

The in-line post-measurement and inspection processing apparatus 14b sends a transmission request via the communication server 20 to the exposure apparatus 13 or the in-line preliminary measurement and inspection apparatus 14a for the parameters used in alignment measurement, alignment measurement results, as well as the various control data for auto-focusing, synchronization accuracy, exposure amount, and the like. The in-line post-measurement and inspection apparatus 14b then acquires these via the communication server 20 (step SC2). Note that, once the main control unit MC of the exposure apparatus 13 has transmitted the aforementioned data to the in-line post-measurement and inspection apparatus 14b, this temporarily recorded data may be immediately deleted.

Using the data acquired from the exposure apparatus 13 or the like, the in-line post-measurement and inspection apparatus 14b analyzes the measurement results obtained by the above described overlay measurement, line width measurement and the like. If the result of this analysis indicates that there is an abnormality in the overlay or line width, notification is given of an alteration to the processing parameters of the exposure apparatus 13 or the in-line preliminary measurement and inspection apparatus 14a via the communications server 20 (step SC3). As a result, the various parameters required to optimize the exposure conditions of the exposure apparatus 13 are fed back to the exposure apparatus 13. In addition, the in-line post-measurement and inspection apparatus 14b records the location of the overlay or line width abnormality.

The above described photoresist coating processing S11, the preliminary measurement and inspection processing S12, the exposure processing S13, the developing processing S14, and the post-measurement and inspection processing S15 are not performed sequentially taking all the wafers W of an entire lot as one unit, but are performed sequentially taking one wafer W as a unit. When each of the above described processings on one lot of wafers W has ended, this lot is transported to the substrate processing apparatus 18 shown in FIG. 1, and etching processing is performed by the etching apparatus 18c. In addition, impurity diffusion processing is performed by an oxidation/ion injection apparatus 18d, and aluminum deposition wiring processing is further performed by a vapor deposition apparatus (not shown) (step S16). Note that, in this step, if necessary, chemical mechanical polishing processing is performed using the CMP apparatus 18b.

By performing the processing in the above described step S11 to step S16, one layer of pattern is formed on the wafer W. Namely, step S11 to step S16 can collectively be called layer formation step S1. A lot that has completed the above described step S16 is transported once again to the CVD apparatus 18a or the coater/developer 15a. In addition, the aforementioned layer formation step S1 is repeated the same number of times as the number of layers to be formed on the wafer W.

Subsequently, a lot that has undergone the above steps is transported to a probing apparatus (not shown), and probing (i.e., inspection) processing is performed (step S17). At this time, because the locations of abnormalities in overlay or line width are known in advance from the post-measurement and inspection processing that was performed in step S15, it is preferable that an inspection of chips having these abnormality locations be omitted in order to improve the device manufacturing efficiency. Because information showing abnormality locations that is obtained by the in-line post-measurement and inspection apparatus 14b is used by the probing apparatus, it is desirable that the probing apparatus be connected to the communication server 20, and that the information showing abnormality locations obtained by the in-line post-measurement and inspection apparatus 14b be transmitted to the probing apparatus via the communications server 20 (step SC4).

When probing processing has ended, repair processing is performed (step S18). When a circuit is being formed on a substrate, redundant portions are formed in parallel with the original element portions. If there are defects in the original elements portions, repair processing to repair the circuit is performed. Repair processing refers to processing in which these element portions are burnt off by laser light using a laser repair apparatus or the like and the circuit is then repaired by using the redundant portions in place of the element portions having the defects. Here, because the locations of abnormalities in overlay or line width are known in advance from the post-measurement and inspection processing that was performed in step S15, it is preferable that repair processing of chips having these abnormality locations be omitted in order to improve the device manufacturing efficiency (step SC4).

In order to realize this type of repair processing, it is desirable that a repair apparatus (not shown) be connected to the communication server 20, and that the information showing abnormality locations obtained by the in-line post-measurement and inspection apparatus 14b be transmitted to the repair apparatus via the communications server 20. Next, dicing processing is performed on the wafer W (step S19). Packaging processing is then performed on each chip divided by the dicing, and bonding processing is also performed (step S20).

A device is manufactured by undergoing the above described steps.

As has been described above, in the present embodiment, a variety of information is exchanged via the communication server 20 between the exposure apparatus 13, the in-line preliminary measurement and inspection apparatus 14a and the in-line post-measurement and inspection apparatus 14b, and various parameters for optimizing the exposure conditions of the exposure apparatus 13 are fed forward or are fed back to the exposure apparatus 13. As a result, information obtained by each device manufacturing processing apparatus can be effectively utilized between the device manufacturing processing apparatuses.

Note that, in the above described embodiment, a case in which a variety of information is exchanged mainly between the exposure apparatus 13, the in-line preliminary measurement and inspection apparatus 14a, and the in-line post-measurement and inspection apparatus 14b that are connected to the communication server 20 is described as an example, however, it is also possible for information to be exchanged between other device manufacturing processing apparatuses (i.e., the truck 15, the analysis system 17, and the substrate processing apparatus 18) that are connected to the communication server 20. Accordingly, information can be effectively utilized between these apparatuses as well.

For example, by transmitting alignment results obtained by the exposure apparatus 13 and the like to the analysis system 17 via the communication server 20, simulation results for the overlay of a pattern formed on the wafer are determined. In addition, by transmitting these simulation results to the exposure apparatus 13 via the communication server 20, the main control unit MC of the exposure apparatus 13 is also able to perform operations such as selecting the alignment marks that are to be measured during an alignment.

An embodiment of the present invention is described above, however, the present invention is not limited to the above described embodiment and modifications can be freely made thereto within the scope of the present invention. For example, in the above described embodiment, a case in which the conversion section 53 of the communication server 20 shown in FIG. 3 is provided with the file format conversion section 53a, the communication message conversion section 53b, and the communication protocol conversion section 53c, and a case in which the conversion section 56 of the communication server 21 shown in FIG. 9 is provided with the file format conversion section 56a, the communication message conversion section 56b, and the communication protocol conversion section 56c are described as examples. However, when it is only necessary for one or two of the format, communication message, and communication protocol of information received by a communication server to be converted, then the conversion sections 53 and 56 may be provided with the function of performing the necessary conversion. Moreover, it is also possible for a conversion definition file format and a condition program format to be used in combination in each conversion section.

Moreover, when the file format conversion definition file F1, the communication message conversion definition file F2, and the communication protocol conversion definition file F3, as well as the confusion recipe files R1 to R3, . . . , that are shown in FIG. 3, or the confusion recipe files R11 to R13, . . . , as well as the file format conversion program P1, the communication message conversion program P2, and the communication protocol conversion program P3 that are shown in FIG. 9 are provided via the Internet, then it is possible to provide a charge system in which a charge can be made in accordance with the number of downloads.

Furthermore, the exposure apparatus 13 in the above described embodiment may be an exposure apparatus that uses a liquid immersion method such as is disclosed in PCT International Patent Publication No. WO 99/49504, or may be an exposure apparatus that does not use a liquid immersion method. An exposure apparatus that uses a liquid immersion method may be any one of a liquid immersion exposure apparatus that selectively fills areas between the projection optical system PL and the wafer W with a liquid, a liquid immersion exposure apparatus that causes a stage on which a substrate that is to be exposed is held to be moved through a liquid tank such as is disclosed in Japanese Unexamined Patent Application, Publication No. H06-124873, and a liquid immersion exposure apparatus that forms a liquid tank to a predetermined depth on a stage and then holds a substrate therein such as is disclosed in Japanese Unexamined Patent Application, Publication No. H10-303114.

Moreover, the above described exposure apparatus 13 may be any one of an exposure apparatus that is used to manufacture semiconductor devices and transfers a device pattern onto a semiconductor wafer, and exposure apparatus that is used to manufacture display units such as liquid crystal display elements (LCD) and transfers a device pattern onto a glass plate, and exposure apparatus that is used to manufacture thin film magnetic heads and transfers a device pattern onto a ceramic wafer, and an exposure apparatus that is used to manufacture image pickup elements such as CCD. Furthermore, the exposure apparatus may also be an exposure apparatus that transfers a circuit pattern onto a glass substrate or a selected wafer or the like in order to manufacture a reticle or mask that is used by a light exposure apparatus, an EUV exposure apparatus, an x-ray exposure apparatus, or an electron beam exposure apparatus or the like. Moreover, the exposure apparatus does not need to be an exposure apparatus that transfers a pattern that is formed on a reticle or mask, that may be a maskless exposure apparatus that transfers a predetermined pattern.

What is claimed is:

1. A connecting device that connects together at least a first device manufacturing processing apparatus being of a first type of device manufacturing processing apparatuses and a second device manufacturing processing apparatus being of a second type of the device manufacturing processing apparatuses, comprising:
    a receiving section that is connected to the first device manufacturing processing apparatus and receives information sent from the first device manufacturing processing apparatus using a method that is suitable for receiving information sent from the first device manufacturing processing apparatus, the information being physical information measured by or provided to at least one of the device manufacturing processing apparatuses used in production of an object;
    an identification section that identifies the type of the first device manufacturing processing apparatus and the type of the second device manufacturing processing apparatus;
    a conversion section that is connected to the receiving section and converts information received by the receiving section into information that is suitable for information receiving by the second device manufacturing processing apparatus that is different from the first device manufacturing processing apparatus based on a selected one of a plurality of conversion files; and
    a transmitting section that is connected to the conversion section and the second device manufacturing processing apparatus and transmits information that has been converted by the conversion section into information that is suitable for information receiving by the second device manufacturing processing apparatus to the second device manufacturing processing apparatus,
    wherein the plurality of conversion files are housed within the connecting device and may be altered by a user receiving the information,
    the selected one of the plurality of conversion files is selected based on the identified types of the first and second device manufacturing processing apparatuses, and the second device manufacturing processing apparatus is designated at the time the information is sent from the first device manufacturing processing apparatus.

2. The connection device according to claim 1, wherein the conversion section is provided with each of:
    a first conversion section that converts a format of the information received by the receiving section into a format that is suitable for processing by the second device manufacturing processing apparatus, the formats representing encoded variable names readable by the respective device manufacturing processing apparatuses;
    a second conversion section that converts data that is based on a communication message system used by the first device manufacturing processing apparatus into data that is based on a communication message system that the second device manufacturing processing apparatus is capable of recognizing, the data representing encoded device manufacturing processing apparatus-recognizable instructions; and
    a third conversion section that converts information received by the receiving section under a communication protocol that is suitable for receiving information sent from the first device manufacturing processing apparatus into information that is transmitted under a communication protocol that is suitable for information receiving by the second device manufacturing processing apparatus, the communication protocols being sets of rules for sending and receiving data.

3. The connection device according to claim 2, further comprising a registration section in which is registered conversion processing information relating to conversion processing in at least one of format conversion processing performed by the first conversion section, conversion processing in accordance with the communication message system that is performed by the second conversion section, and conversion processing in accordance with the communication protocol that is performed by the third conversion section.

4. The connection device according to claim 3, wherein the conversion processing information is registered in the registration section in file mode.

5. The connection device according to claim 3, further comprising a recipe registration section in which are registered conversion recipes that link together at least two of conversion processing information relating to format conversion processing performed by the first conversion section, conversion processing information relating to conversion processing in accordance with the communication message system that is performed by the second conversion section, and conversion processing information relating to conversion processing in accordance with the communication protocol that is performed by the third conversion section.

6. The connection device according to claim 5, wherein the information registered in the recipe registration section is registered in file mode.

7. The connection device according to claim 3, further comprising a recipe registration section in which are registered at least one of conversion recipes that link together a plurality of conversion processing information items relating to format conversion processing performed by the first conversion section, conversion recipes that link together a plurality of conversion processing information items relating to conversion processing in accordance with the communication message system that is performed by the second conversion section, and conversion recipes that link together a plurality of conversion processing information items relating to conversion processing in accordance with the communication protocol that is performed by the third conversion section.

8. The connection device according to claim 1, further comprising a registration section in which is registered conversion processing information relating to conversion processing performed by the conversion section, wherein in the registration section are registered:

first conversion processing information that is used to convert information received from the first device manufacturing processing apparatus into information that is suitable for receiving by the second device manufacturing processing apparatus; and second conversion processing information that is used to convert information received from the second device manufacturing processing apparatus into information that is suitable for receiving by a third device manufacturing processing apparatus, and wherein synthesized conversion processing information is created by synthesizing the first conversion processing information with the second conversion processing information and, using the synthesized conversion processing information, information received from the first device manufacturing processing apparatus is converted into information that is suitable for receiving by the third device manufacturing apparatus without it being converted into information that is suitable for receiving by the second device manufacturing apparatus.

9. The connection device according to claim 3, wherein the conversion processing information is at least a portion of a conversion program used by the conversion section.

10. The connection device according to claim 1, wherein waveform image data received by the receiving section from the first device manufacturing processing apparatus is converted by the conversion section and is transmitted from the transmitting section to the second device manufacturing processing apparatus.

11. The connection device according to claim 10, wherein a predetermined offset is added to the waveform image data from the first device manufacturing processing apparatus by the conversion section, and the waveform image data having the predetermined offset added thereto is transmitted by the transmitting section to the second device manufacturing processing apparatus.

12. The connection device according to claim 11, wherein the waveform image data is data showing results of predetermined measurements, and shows a relationship between positional information of an object that is measured by the predetermined measurements and measurement results at each position of the object, or shows a relationship between time information that is measured by the predetermined measurements and measurement results at each time, and the conversion section adds offset to the measurement results for each position or for each time.

13. The connection device according to claim 1, wherein the at least a first and second device manufacturing processing apparatuses include at least one of an exposure apparatus that transfers a predetermined pattern onto a substrate by exposure, a preliminary measurement and inspection apparatus that performs at least one of measuring and inspecting a substrate that is to be exposed, and a post-measurement and inspection apparatus that performs at least one of measuring and inspecting a substrate after an exposure has been completed.

14. The connection device according to claim 1, wherein the at least a first and second device manufacturing processing apparatuses include at least one of a coater/developer, a CVD apparatus that forms a thin-film layer on s substrate, a CMP apparatus that flattens a surface of a substrate, an etching apparatus, and an oxidation/ion injection apparatus that forms an oxide film layer on the substrate and injects impurities at a predetermined position thereof.

15. A connection method for connecting together at least a first device manufacturing processing apparatus being of a first type of device manufacturing processing apparatuses and a second device manufacturing processing apparatus being of a second type of the device manufacturing processing apparatuses, the method comprising:

receiving information transmitted from the first device manufacturing processing apparatus, compatibly with the first device manufacturing processing apparatus, the information being physical information measured by or provided to at least one of the device manufacturing processing apparatuses used in production of an object;

identifying the type of the first device manufacturing processing apparatus and the type of the second device manufacturing processing apparatus; and transmitting the received information compatibly with the second device manufacturing processing apparatus that is a destination of the transmission based on a selected one of a plurality of conversion files, wherein the plurality of conversion files are housed in a connecting device that connects the first device manufacturing processing apparatus and the second device and may be altered by a user receiving the information, the selected one of the plurality of conversion files is selected based on the identified types of the first and second device manufacturing processing apparatuses, and the second device manufacturing processing apparatus is designated at the time the information is sent from the first device manufacturing processing apparatus.

16. The connection method according to claim 15, further comprising executing conversion of each of:

a first step in which a format of the information transmitted from the first device manufacturing processing apparatus is converted into a format that is suitable for processing by the second device manufacturing processing apparatus, the formats representing encoded variable names readable by the respective device manufacturing processing apparatuses;

a second conversion step in which data that is based on a communication message system used in communication with the first device manufacturing processing apparatus is converted into data that is based on a communication message system that the second device manufacturing processing apparatus is capable of recognizing, the data representing device manufacturing processing apparatus-readable instructions; and a third conversion step in which information received under a communication protocol that is suitable for receiving information sent from the first device manufacturing processing apparatus is converted into information that is transmitted under a communication protocol that is suitable for information receiving by the second device manufacturing processing apparatus, the communication protocols being sets of rules for sending and receiving data.

17. The connection method according to claim 16, wherein conversion processing information that are stored in advance in a storage device is read from the storage device, and conversion processing is executed based on the read conversion processing information, the conversion processing information being related to conversion processing in at least one of format conversion processing performed in the first step, conversion processing in accordance with the communication message system that is performed in the second step, and conversion processing in accordance with the communication protocol that is performed in the third step.

18. The connection method according to claim 17, wherein a conversion recipe that is stored in advance in a storage device is read from the storage device, and conversion processing is executed based on the read conversion recipe, the conversion recipe linking together at least two of conversion processing information relating to format conversion processing performed in the first step, conversion processing information relating to conversion processing in accordance with the communication message system that is performed in the second step, and conversion processing information relating to conversion processing in accordance with the communication protocol that is performed in the third step.

19. The connection method according to claim 15, wherein waveform image data received from the first device manufacturing processing apparatus is converted and transmitted to the second device manufacturing processing apparatus.

20. A non-transitory computer-readable storage medium storing a program that causes at least a portion of information communication processing between at least a first device manufacturing processing apparatus being of a first type and a second device manufacturing process apparatus being of a second type to be executed on a computer, the program consisting of the following processes:
receiving information transmitted from a first device manufacturing processing apparatus, compatibly with the first device manufacturing processing apparatus; and
identifying the type of the first device manufacturing processing apparatus and the type of the second device manufacturing processing apparatus;
transmitting the received information compatibly with the second device manufacturing processing apparatus that is a destination of the transmission, based on a selected one of a plurality of conversion files,
wherein the plurality of conversion files are housed within the computer and may be altered by a user receiving the information,
the selected one of the plurality of conversion files is selected based on the identified types of the first and second device manufacturing processing apparatuses, and the second device manufacturing processing apparatus is designated at the time the information is sent from the first device manufacturing processing apparatus.

21. The computer-readable storage medium storing the program according to claim 20, wherein the program causes each of:
a first conversion function that converts a format of the information transmitted from the first device manufacturing processing apparatus into a format that is suitable for processing by the second device manufacturing processing apparatus, the formats representing encoded variable names readable by the respective device manufacturing processing apparatuses;
a second conversion function that converts data that is based on a communication message system used in communication with the first device manufacturing processing apparatus into data that is based on a communication message system that the second device manufacturing processing apparatus is capable of recognizing, the data representing encoded device manufacturing processing apparatus-readable instructions; and
a third conversion function that converts information received under a communication protocol that is suitable for receiving information sent from the first device manufacturing processing apparatus into information that is transmitted under a communication protocol that is suitable for information receiving by the second device manufacturing processing apparatus, the communication protocols being sets of rules for sending and receiving data.

22. The computer-readable storage medium storing the program according to claim 21, wherein the program causes conversion processing information that are stored in advance in a storage device to be read from the storage device, and causes conversion processing to be executed on a computer based on the read conversion processing information, the conversion processing information being related to conversion processing in at least one of format conversion processing performed by the first function, conversion processing in accordance with the communication message system that is performed by the second function, and conversion processing in accordance with the communication protocol that is performed by the third function.

23. The computer-readable storage medium storing the program according to claim 22, wherein the program causes conversion recipes that are stored in advance in a storage device are read from the storage device, and causes conversion processing to be executed on a computer based on the read conversion recipe, the conversion recipe linking together at least two of conversion processing information relating to format conversion processing performed by the first function, conversion processing information relating to conversion processing in accordance with the communication message system that is performed by the second function, and conversion processing information relating to conversion processing in accordance with the communication protocol that is performed by the third function.

24. The computer-readable storage medium storing the program according to claim 20, wherein a function to convert waveform image data received from the first device manufacturing processing apparatus and transmit the converted data to the second device manufacturing processing apparatus is executed on a computer.

25. A device manufacturing processing system comprising:
a first device manufacturing processing apparatus of a first type of device manufacturing processing apparatuses;
a second device manufacturing processing apparatus of a second type of the device manufacturing processing apparatuses; and
a connection device that connects together the first device manufacturing processing apparatus and the second device manufacturing processing apparatus, wherein
the connection device comprises:
a receiving section that is connected to the first device manufacturing processing apparatus and receives information sent from the first device manufacturing processing apparatus using a method that is suitable for receiving information sent from the first device manufacturing processing apparatus, the information being physical information measured by or provided to at least one of the device manufacturing processing apparatuses used in production of an object;
an identification section that identifies the type of the first device manufacturing processing apparatus and the type of the second device manufacturing processing apparatus;
a conversion section that is connected to the receiving section and converts information received by the receiving section into information that is suitable for information receiving by the second device manufacturing processing apparatus based on a selected one of a plurality of conversion files; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, wherein the plurality of conversion files are housed within the connection device and may be altered by a user receiving the information, the selected one of the plurality of conversion files is selected based on the identified types of the first and second device manufacturing processing apparatuses, and the second device manufacturing processing apparatus is designated at the time the information is sent from the first device manufacturing processing apparatus.

26. The device manufacturing processing system according to claim 25, wherein the conversion section is provided with each of:

a first conversion section that converts a format of the information received by the receiving section into a format that is suitable for processing by the second device manufacturing processing apparatus, the formats representing encoded variable names readable by the respective device manufacturing processing apparatuses;

a second conversion section that converts data that is based on a communication message system used by the first device manufacturing processing apparatus into data that is based on a communication message system that the second device manufacturing processing apparatus is capable of recognizing, the data representing encoded device manufacturing processing apparatus-readable instructions; and a third conversion section that converts information received by the receiving section under a communication protocol that is suitable for receiving information sent from the first device manufacturing processing apparatus into information that is transmitted under a communication protocol that is suitable for information receiving by the second device manufacturing processing apparatus, the communication protocols being sets of rules for sending and receiving data.

27. The device manufacturing processing system according to claim 26, further comprising a registration section in which is registered conversion processing information that relates to conversion processing in at least one of format conversion processing performed by the first conversion section, conversion processing in accordance with the communication message system that is performed by the second conversion section, and conversion processing in accordance with the communication protocol that is performed by the third conversion section.

28. The device manufacturing processing system according to claim 27, wherein the connection device is provided with a plurality of connection devices, and wherein conversion processing information that is not registered in the registration section of a particular connection device from among the plurality of connection devices can be acquired via a network from another connection device that is different from the particular connection device.

29. The device manufacturing processing system according to claim 27, further comprising a recipe registration section in which are registered conversion recipes that link together at least two of conversion processing information relating to format conversion processing performed by the first conversion section, conversion processing information relating to conversion processing in accordance with the communication message system that is performed by the second conversion section, and conversion processing information relating to conversion processing in accordance with the communication protocol that is performed by the third conversion section.

30. The device manufacturing processing system according to claim 29, wherein the connection device is provided with a plurality of connection devices, and wherein conversion recipes that are not registered in the recipe registration section of a particular connection device from among the plurality of connection devices can be acquired via a network from another connection device that is different from the particular connection device.

31. The device manufacturing processing system according to claim 25, wherein the device manufacturing processing apparatuses include at least one of an exposure apparatus that transfers a predetermined pattern onto a substrate by exposure, a preliminary measurement and inspection apparatus that performs at least one of measuring and inspecting a substrate that is to be exposed, and a post-measurement and inspection apparatus that performs at least one of measuring and inspecting a substrate after an exposure has been completed.

32. The device manufacturing processing system according to claim 25, further comprising a host computer that collectively controls a plurality of device manufacturing processing apparatuses that include at least the first device manufacturing processing apparatus and the second device manufacturing processing apparatus, and the host computer is connected to the first device manufacturing processing apparatus and the second device manufacturing processing apparatus via a connection network which is set up independently from the connection network that includes the connection device and which does not use the connection device.

33. An exposure apparatus that transfers a predetermined pattern onto a substrate by exposure and is connected to a connection device which connects together at least a first device manufacturing processing apparatus of a first type of device manufacturing processing apparatuses and a second device manufacturing processing apparatus of a second type of the device manufacturing processing apparatuses, the connection device comprising:

a receiving section that is connected to the first device manufacturing processing apparatus and receives information sent from the first device manufacturing processing apparatus using a method that is suitable for receiving information sent from the first device manufacturing processing apparatus, the information being physical information measured by or provided to at least one of the device manufacturing processing apparatuses used in production of an object;

an identification section that identifies the type of the first device manufacturing processing apparatus and the type of the second device manufacturing processing apparatus;

a conversion section that is connected to the receiving section and converts information received by the receiving section into information that is suitable for information receiving by the second device manufacturing processing apparatus that is different from the first device manufacturing processing apparatus based on a selected one of a plurality of conversion files; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, wherein the plurality of conversion files are housed within the connection device and may be altered by a user receiving the information, the selected one of the plurality of conversion files is selected based on the identified types of the first and second device manufacturing processing apparatuses, and the second device manufacturing processing apparatus is designated at the time the information is sent from the first device manufacturing processing apparatus.

34. The exposure apparatus according to claim 33, wherein the information received by the receiving section of the connection device is transmitted.

35. The exposure apparatus according to claim 33, wherein the information transmitted from the transmitting section of the connection device is received, and exposure processing is executed based on the received information.

36. An exposure method in which exposure processing is executed using the exposure apparatus according to claim 33.

37. A measurement and inspection apparatus that performs at least one of a predetermined measurement or inspection of a substrate and is connected to a connection device which connects together at least a first device manufacturing processing apparatus of a first type of device manufacturing processing apparatuses and a second device manufacturing processing apparatus of a second type of the device manufacturing processing apparatuses, the connection device comprising:

a receiving section that is connected to the first device manufacturing processing apparatus and receives information sent from the first device manufacturing processing apparatus using a method that is suitable for receiving information sent from the first device manufacturing processing apparatus, the information being physical information measured by or provided to at least one of the device manufacturing processing apparatuses used in production of an object;

an identification section that identifies the type of the first device manufacturing processing apparatus and the type of the second device manufacturing processing apparatus;

a conversion section that is connected to the receiving section and converts information received by the receiving section into information that is suitable for information receiving by the second device manufacturing processing apparatus that is different from the first device manufacturing processing apparatus based on a selected one of a plurality of conversion files; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, wherein the plurality of conversion files are housed within the connection device and may be altered by a user receiving the information, the selected one of the plurality of conversion files is selected based on the identified types of the first and second device manufacturing processing apparatuses, and the second device manufacturing processing apparatus is designated at the time the information is sent from the first device manufacturing processing apparatus.

38. The measurement and inspection apparatus according to claim 37, wherein the information received by the receiving section of the connection device is transmitted.

39. The measurement and inspection apparatus according to claim 37, wherein the information transmitted from the transmitting section of the connection device is received, and at least one of a measurement or an inspection is made based on the received information.

40. A measurement and inspection method in which at least one of a predetermined measurement or inspection of a substrate is made using the measurement and inspection apparatus according to claim 37.

41. A connecting device that connects together at least a first processing apparatus being of a first type of device manufacturing processing apparatuses and a second processing apparatus being of a second type of the device manufacturing processing apparatuses, comprising:

a receiving section that is connected to the first processing apparatus and receives information sent from the first processing apparatus using a method that is suitable for receiving information sent from the first processing apparatus, the information being physical information measured by or provided to at least one of the device manufacturing processing apparatuses used in production of an object;

an identification section that identifies the type of the first processing apparatus and the type of the second processing apparatus;

a conversion section that is connected to the receiving section and converts information received by the receiving section into information that is suitable for information receiving by the second processing apparatus that is different from the first processing apparatus based on a selected one of a plurality of conversion files; and a transmitting section that is connected to the conversion section and the first processing apparatus and transmits information that has been converted by the conversion section into information that is suitable for information receiving by the second processing apparatus to the second processing apparatus, wherein the plurality of conversion files are housed within the connecting device and may be altered by a user receiving the information, and the selected one of the plurality of conversion files is selected based on the identified types of the first and second processing apparatuses, and the second processing apparatus is designated at the time the information is sent from the first processing apparatus.

42. A connecting device that connects together at least a first device manufacturing processing apparatus being of a first type of device manufacturing processing apparatuses and a second device manufacturing processing apparatus being of a second type of the device manufacturing processing apparatuses, comprising:

a receiving section that is connected to the first device manufacturing processing apparatus and receives information sent from the first device manufacturing processing apparatus using a method that is suitable for receiving information sent from the first device manufacturing processing apparatus, the information being physical information measured by or provided to at least one of the device manufacturing processing apparatuses used in production of an object;

an identification section that identifies the type of the first device manufacturing processing apparatus and the type of the second device manufacturing processing apparatus;

a conversion section that is connected to the receiving section and converts information received by the receiving section into information that is suitable for information receiving by the second device manufacturing processing apparatus that is different from the first device manufacturing processing apparatus based on a selected one of a plurality of conversion files; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, wherein the plurality of conversion files are housed within the connecting device and may be altered by a user receiving the information, and the conversion section is provided with each of:
  a first conversion section that converts a format of the information received by the receiving section into a format that is suitable for processing by the second device manufacturing processing apparatus, the formats representing encoded variable names readable by the respective device manufacturing processing apparatuses;
  a second conversion section that converts data that is based on a communication message system used by the first device manufacturing processing apparatus into data that is based on a communication message system that the second device manufacturing processing apparatus is capable of recognizing, the data representing encoded device manufacturing processing apparatus-recognizable instructions; and
  a third conversion section that converts information received by the receiving section under a communication protocol that is suitable for receiving information sent from the first device manufacturing processing apparatus into information that is transmitted under a communication protocol that is suitable for information receiving by the second device manufacturing processing apparatus, the communication protocols being sets of rules for sending and receiving data.

43. A connecting device that connects together at least a first device manufacturing processing apparatus being of a first type and a second device manufacturing processing apparatus being of a second type, comprising:

a receiving section that is connected to the first device manufacturing processing apparatus and receives information sent from the first device manufacturing processing apparatus using a method that is suitable for receiving information sent from the first device manufacturing processing apparatus;

an identification section that identifies the type of the first device manufacturing processing apparatus and the type of the second device manufacturing processing apparatus;

a conversion section that is connected to the receiving section and converts information received by the receiving section into information that is suitable for information receiving by the second device manufacturing processing apparatus that is different from the first device manufacturing processing apparatus based on a selected one of a plurality of conversion files; and a transmitting section that is connected to the conversion section and the second device manufacturing processing apparatus and transmits information that has been converted by the conversion section into information that is suitable for information receiving by the second device manufacturing processing apparatus to the second device manufacturing processing apparatus, wherein the plurality of conversion files are housed within the connecting device and may be altered by a user receiving the information, the selected one of the plurality of conversion files is selected based on the identified types of the first and second device manufacturing processing apparatuses, and the second device manufacturing processing apparatus is designated at the time the information is sent from the first device manufacturing processing apparatus, waveform image data received by the receiving section from the first device manufacturing processing apparatus is converted by the conversion section and is transmitted from the transmitting section to the second device manufacturing processing apparatus, and a predetermined offset is added to the waveform image data from the first device manufacturing processing apparatus by the conversion section, and the waveform image data having the predetermined offset added thereto is transmitted by the transmitting section to the second device manufacturing processing apparatus.

\* \* \* \* \*